United States Patent
Szymanowski et al.

(10) Patent No.: US 9,589,927 B2
(45) Date of Patent: Mar. 7, 2017

(54) PACKAGED RF AMPLIFIER DEVICES WITH GROUNDED ISOLATION STRUCTURES AND METHODS OF MANUFACTURE THEREOF

(71) Applicant: FREESCALE SEMICONDUCTOR, INC., Austin, TX (US)

(72) Inventors: Margaret A. Szymanowski, Chandler, AZ (US); Kimberly J. Foxx, Phoenix, AZ (US); Robert A. Pryor, Mesa, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/496,477

(22) Filed: Sep. 25, 2014

(65) Prior Publication Data

US 2016/0087588 A1  Mar. 24, 2016

Related U.S. Application Data

(63) Continuation-in-part of application No. 14/491,574, filed on Sep. 19, 2014, now Pat. No. 9,337,774.

(51) Int. Cl.
*H01L 23/495* (2006.01)
*H01L 21/332* (2006.01)
(Continued)

(52) U.S. Cl.
CPC .............. *H01L 24/85* (2013.01); *H01L 23/66* (2013.01); *H03F 1/0288* (2013.01);
(Continued)

(58) Field of Classification Search
CPC ............. H01L 21/563; H01L 21/67236; H01L 23/3114; H01L 23/4951; H01L 23/538;
(Continued)

(56) References Cited

U.S. PATENT DOCUMENTS 5,681,757 A     10/1997 Hayes
2008/0057628 A1  3/2008 Sane et al.
(Continued)

OTHER PUBLICATIONS

Henkel,QMI519 Technical Data Sheet, Feb. 2012, pp. 1-2.
Henkel, ABLEBOND 8290 Technical Data Sheet, Aug. 2011, pp. 1-2.
Henkel, QMI529HT-LV Technical Data Sheet, Sep. 2010, pp. 1-2.

*Primary Examiner* — Julio J Maldonado
*Assistant Examiner* — Moin Rahman

(57) ABSTRACT

An embodiment of a packaged RF amplifier device includes a device substrate, a transistor die coupled to the device substrate, and an isolation structure coupled to the transistor die. The transistor die has a top die surface, a bottom die surface, a semiconductor substrate, first and second transistors formed in the semiconductor substrate, a conductive structure at the top die surface and positioned between the first and second transistors, and a low resistance path that extends vertically through the semiconductor substrate between the conductive structure and the bottom die surface. The isolation structure is coupled to the conductive structure and extends into an area above the top die surface between the first and second transistors. The isolation structure may be a wirebond fence, a conductive wall, conductive pillars or vias, or a plated trench that extends vertically upward from the conductive structure. The device may be encapsulated with molding compound.

20 Claims, 12 Drawing Sheets

(51) Int. Cl.
*H01L 23/00* (2006.01)
*H01L 23/66* (2006.01)
*H03F 1/02* (2006.01)
*H03F 1/56* (2006.01)
*H03F 3/193* (2006.01)

(52) U.S. Cl.
CPC ............. *H03F 1/565* (2013.01); *H03F 3/193* (2013.01); *H01L 2224/49111* (2013.01); *H01L 2224/73265* (2013.01); *H01L 2924/13091* (2013.01); *H01L 2924/181* (2013.01); *H03F 2200/36* (2013.01); *H03F 2200/451* (2013.01)

(58) Field of Classification Search
CPC ..... H01L 23/5389; H01L 24/01; H01L 24/10; H01L 24/18; H01L 24/82; H01L 2021/60022; H01L 2224/01; H01L 2224/08135; H01L 2224/32135; H01L 2224/82
USPC ....... 257/700, 296, 592, 676, 666, 528, 368, 257/531; 438/136, 137, 156, 173, 192, 438/206, 212, 424, 427, 428, 591
See application file for complete search history.

(56) References Cited

U.S. PATENT DOCUMENTS

| | | | |
|---|---|---|---|
| 2008/0157341 A1* | 7/2008 | Yang | H01L 23/467 257/700 |
| 2010/0246152 A1* | 9/2010 | Lin | G06F 1/16 361/783 |
| 2011/0012254 A1 | 1/2011 | Mohammed et al. | |
| 2011/0074006 A1* | 3/2011 | Wood | H01L 23/642 257/691 |
| 2011/0115064 A1* | 5/2011 | Radojcic | H01L 25/0657 257/686 |
| 2013/0292808 A1* | 11/2013 | Yen | H01L 23/552 257/660 |
| 2014/0021598 A1 | 1/2014 | Sutardja | |

* cited by examiner

US 9,589,927 B2

PACKAGED RF AMPLIFIER DEVICES WITH GROUNDED ISOLATION STRUCTURES AND METHODS OF MANUFACTURE THEREOF

RELATED APPLICATION

This application is a continuation-in-part of co-pending, U.S. patent application Ser. No. 14/491,574, filed on Sep. 19, 2014.

TECHNICAL FIELD

Embodiments of the subject matter described herein relate generally to packaged semiconductor devices, and more particularly to packaged, high-power, radio frequency (RF) semiconductor devices.

BACKGROUND

A typical high power, radio frequency (RF) semiconductor device may include one or more input leads, one or more output leads, one or more transistors, wirebonds coupling the input lead(s) to the transistor(s), and wirebonds coupling the transistor(s) to the output lead(s). The wirebonds have significant inductances at high frequencies, and such inductances may be factored into the design of input and output circuits for a device. In air-cavity packages, input and output circuits may be contained within the same package that contains the device's transistor(s). More specifically, an in-package, input impedance matching circuit may be coupled between a device's input lead and a control terminal (e.g., the gate) of a transistor, and an in-package, output circuit (e.g., including an output impedance matching circuit) may be coupled between a current conducting terminal (e.g., the drain) of a transistor and a device's output lead. Each of the input and output circuits may include one or more capacitive and resistive elements, along with the inductances inherent in the sets of wirebonds interconnecting those elements with the device's transistor(s) and with the input and output leads. The values of the various components in the input and output circuits affect a number of device performance parameters, including device efficiency, instantaneous signal bandwidth (ISBW), and so on.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
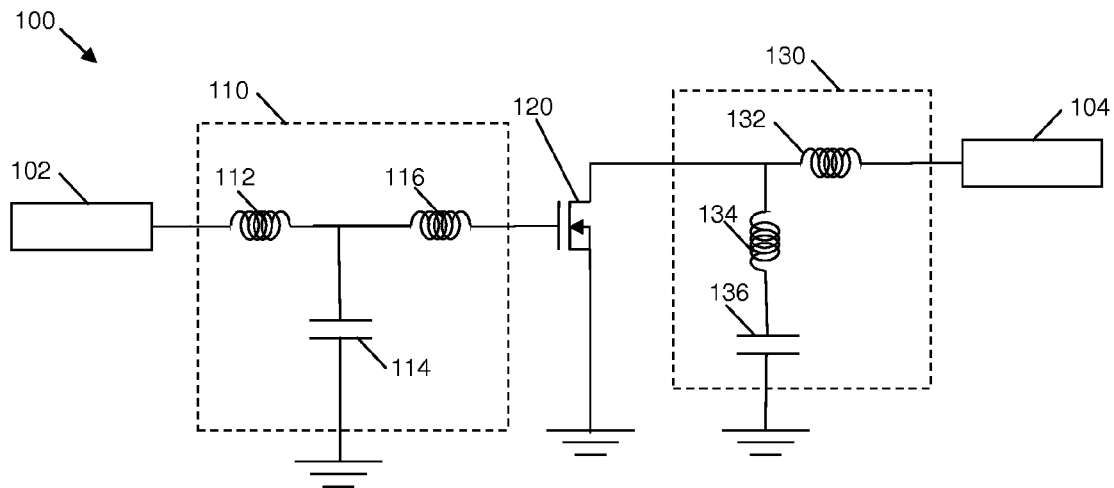
FIG. 1 is a schematic diagram of an RF amplifier device, in accordance with an example embodiment.

As discussed above, an in-package, input impedance matching circuit may be coupled between a device's input lead and a control terminal (e.g., the gate) of a transistor, and/or an in-package, output impedance matching circuit may be coupled between a current conducting terminal (e.g., the drain) of a transistor and a device's output lead. In air-cavity packages, some of the components of the input and/or output impedance matching circuit may be implemented in an integrated passive device (IPD). Basically, an IPD is a die that is distinct from the device's transistor die, and that includes one or more capacitors, inductors, and/or resistors formed in or over a relatively thin substrate. The IPD may include one or more contact terminals on a top surface of the IPD (e.g., to which wirebonds may be attached), and one or more conductive features on the bottom surface of the IPD (e.g., for electrical attachment of the IPD to a voltage reference plane of the device). In addition, the IPD may include a plurality of through substrate vias (TSVs) that provide for electrical connectivity between the passive devices of the IPD and the conductive features on the bottom surface of the IPD.

Because IPD technologies may use thin substrates and TSVs, relatively high quality capacitors may be produced using IPD technologies, when compared with capacitors produced using other conventional technologies. For example, some conventional transistor die may include relatively thick substrates on which impedance matching components (e.g., metal-insulator-metal (MIM) capacitors) are formed. Although integration of the impedance matching components on the transistor die itself may have certain advantages, the quality of the capacitors may be less, when compared with capacitors that are included in IPDs. The relatively low quality capacitors may result in poorer RF performance.

In RF amplifier devices that are housed within air cavity packages, IPDs have been successfully implemented to provide portions of input and output impedance matching networks. However, IPDs have not been implemented in overmolded RF amplifier devices because the significant package stresses imparted by the encapsulant could damage the relatively thin IPDs and/or otherwise degrade the performance of the RF amplifier devices. Accordingly, conventional overmolded RF amplifier devices typically include a single, relatively thick transistor die coupled to the device substrate. In some cases, impedance transformation components are implemented in the transistor die. However, as indicated above, the quality of capacitors integrated within a relatively thick transistor die may be low, when compared with the quality of capacitors implemented in an IPD. In addition, implementation of impedance transformation components in the transistor die significantly increases the transistor die size, and thus the overall size of the RF device.

As will be described in detail below, embodiments of RF devices and methods of their formation enable IPDs to be reliably incorporated into overmolded packages even in the face of significant package stresses. More specifically, embodiments of RF devices include improved IPD attachment materials and methods and more physically robust IPDs.

In addition, embodiments of RF devices and methods of their formation, described below, include features that increase the level of isolation between signal paths in multi-path RF amplifier devices (e.g., RF amplifier devices incorporated into Doherty amplifiers or other multi-path amplifiers). For example, various embodiments include additional isolation leads and a wirebond fence between the components of each of the multiple paths, where the wirebond fence reduces inductive coupling between the paths. In embodiments in which the wirebond fences attach directly to a conductive device substrate (e.g., a copper device substrate), processing techniques are employed to ensure reliable attachment in the face of surface contamination that may occur on the device substrate during prior processing steps. Isolation also may be increased, in various embodiments, by including non-parallel (or "angled") sets of wirebonds in the multiple paths.

An embodiment of a packaged RF device includes a device substrate with a voltage reference plane, and a plurality of elements that make up a signal path. The plurality of elements includes an input lead, an output lead, a transistor, and a second die (e.g., an IPD). The transistor die is coupled to the top surface of the device substrate with a solder bond, and the second die is coupled to the top surface of the device substrate with a conductive epoxy that electrically couples at least one component of the second die to the voltage reference plane. A non-conductive molding compound over the top surface of the device substrate encompasses the first transistor die, the second die, a portion of the first input lead, and a portion of the first output lead. In other embodiments, the device may include elements that make up one or more additional signal paths. Isolation between the signal paths may be increased by including a wirebond fence and/or angled sets of wirebonds. Each of these embodiments will be described in detail below.

FIG. 1 is a schematic diagram of an RF amplifier device 100. Device 100 includes an input lead 102, an input impedance matching circuit 110, a transistor 120, an output impedance matching circuit 130, and an output lead 104, in an embodiment. Although transistor 120 and various elements of the input and output impedance matching circuits 110, 130 are shown as singular components, the depiction is for the purpose of ease of explanation only. Those of skill in the art would understand, based on the description herein, that transistor 120 and/or certain elements of the input and output impedance matching circuits 110, 130 each may be implemented as multiple components (e.g., connected in parallel or in series with each other), and examples of such embodiments are illustrated in the other Figures and described later. For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 120 and various elements of the input and output impedance matching circuits 110, 130, below, thus is not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically located between the exterior and the interior of the device's package. Input impedance matching circuit 110 is electrically coupled between the input lead 102 and a first terminal of transistor 120, which is also located within the device's interior, and output impedance matching circuit 130 is electrically coupled between a second terminal of transistor 120 and the output lead 104.

According to an embodiment, transistor 120 is the primary active component of device 100. Transistor 120 includes a control terminal and two current conducting terminals, where the current conducting terminals are spatially and electrically separated by a variable-conductivity channel. For example, transistor 120 may be a field effect transistor (FET) (such as a metal oxide semiconductor FET (MOSFET)), which includes a gate (control terminal), a drain (a first current conducting terminal), and a source (a second current conducting terminal). Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 120 is coupled to the input impedance matching circuit 110, the drain of transistor 120 is coupled to the output impedance matching circuit 130, and the source of transistor 120 is coupled to ground (or another voltage reference). Through the variation of control signals provided to the gate of transistor 120, the current between the current conducting terminals of transistor 120 may be modulated.

Input impedance matching circuit 110 is configured to raise the impedance of device 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface). Input impedance matching circuit 110 is coupled between the input lead 102 and the control terminal (e.g., gate) of the transistor 120. According to an embodiment, input impedance matching circuit 110 includes two inductive elements 112, 116 (e.g., two sets of wirebonds) and a shunt capacitor 114. A first inductive element 112 (e.g., a first set of wirebonds) is coupled between input lead 102 and a first terminal of capacitor 114, and a second inductive element 116 (e.g., a second set of wirebonds) is coupled between the first terminal of capacitor 114 and the control terminal of transistor 120. The second terminal of capacitor 114 is coupled to ground (or another voltage reference).

The combination of inductive elements 112, 116 and shunt capacitor 114 functions as a low-pass filter. According to an embodiment, the combination of inductive elements 112 and 116 may have a value in a range between about 50 picohenries (pH) to about 3 nanohenries (nH), and shunt capacitor 114 may have a value in a range between about 5 picofarads (pF) to about 80 pF. In other embodiments, the combination of inductive elements 112 and 116 and/or shunt capacitor 114 may have values larger or smaller than the above-given ranges.

Output impedance matching circuit 130 is configured to match the output impedance of device 100 with the input impedance of an external circuit or component (not shown) that may be coupled to output lead 104. Output impedance matching circuit 130 is coupled between the first current conducting terminal (e.g., drain) of transistor 120 and the output lead 104. According to an embodiment, output impedance matching circuit 130 includes two inductive elements 132, 134 (e.g., two sets of wirebonds) and one capacitor 136. A first inductive element 132 (e.g., a third set of wirebonds) is coupled between the first current conducting terminal (e.g., drain) of transistor 120 and the output lead 104. A second inductive element 134 (e.g., a fourth set of wirebonds) is coupled between the first current conducting terminal of transistor 120 and a first terminal of capacitor 136. A second terminal of capacitor 136 is coupled to ground (or to another voltage reference), in an embodiment.

Inductor 134 and capacitor 136 are coupled in series between a current conducting terminal of transistor 120 and ground, and this combination of impedance matching elements functions as a high-pass matching stage. According to an embodiment shunt inductor 134 may have a value in a range between about 100 pH to about 3 nH, and shunt capacitor 136 may have a value in a range between about 20 pF to about 500 pF, although these components may have values outside of these ranges, as well. In other embodiments, shunt inductor 134 and/or shunt capacitor 136 may have values larger or smaller than the above-given ranges.

An RF cold point is present at the interconnection between shunt inductor 134 and shunt capacitor 136. According to an embodiment, an envelope frequency termination circuit (not shown) may be coupled between the RF cold point and the ground reference. For example, an envelope frequency termination circuit may include an inductive element, a resistor, and a capacitor coupled in series.

As depicted in FIG. 1 and described above, the input lead 102, input impedance matching circuit 110, transistor 120, output impedance matching circuit 130, and output lead 104 are coupled in series along a signal path of the device 100. The components corresponding to the signal path are incorporated into an overmolded (or encapsulated) RF device, in an embodiment. Further, as will be described in more detail below, additional components corresponding to additional signal paths also may be incorporated into the overmolded RF device. For example, the multiple signal paths may correspond to a multi-path amplifier in which the same RF input signal is provided to each of the multiple signal paths, and the multiple signal paths process the RF signal in parallel. Alternatively, the multiple signal paths may correspond to an amplifier in which separate RF input signals are provided to each of the multiple signal paths. For example, when the device forms a portion of a Doherty amplifier, the multiple signal paths may correspond to a main signal path (i.e., including a main amplifier) and one or more peaking signal paths (i.e., including one or more peaking amplifiers). Device embodiments described below correspond to devices that include two signal paths that receive separate RF input signals. Those of skill in the art would understand, based on the description herein, that other device embodiments may include a single signal path, more than two signal paths, and multiple signal paths that process the same RF signal (e.g., that include multiple transistors coupled in parallel between a single input lead and a single output lead). Such embodiments are intended to be included within the scope of the inventive subject matter.

Embodiments of RF amplifier devices include a device substrate that includes a voltage reference plane, one or more input leads, one or more output leads, one or more transistor die coupled to a top surface of the device substrate with solder, one or more additional die coupled to the top surface of the device substrate with a conductive epoxy, and non-conductive molding compound (or encapsulant) over the top surface of the device substrate and encompassing the transistor die, the additional die, and portions of the input and output leads.

According to further embodiments, the additional die forms a portion of the input matching circuit and/or output matching circuit. Accordingly, the additional die is/are included in the signal path(s) of the device. For example, one of the additional die may include an IPD with a capacitor of an input impedance matching circuit (e.g., capacitor 114 of circuit 110), and another of the additional die may include an IPD with a capacitor of an output impedance matching circuit (e.g., capacitor 136 of circuit 130). In such an embodiment, a first electrode of each capacitor may be electrically coupled to a lead (e.g., lead 102 or 104) or to a terminal of the transistor (e.g., the gate or drain of transistor 120), and a second electrode of each capacitor may be electrically coupled to the voltage reference plane of the device. According to a particular embodiment, the second electrode of each capacitor is electrically coupled to a voltage reference plane of the device through TSVs and the conductive epoxy that physically and electrically couples the additional die to the device substrate.

Embodiments of methods for fabricating a packaged RF device now will be described. Although a single device may be fabricated in isolation, fabrication more typically will include producing multiple devices in parallel. For example, the description below refers to fabricating a device that includes a "leadframe." A leadframe is a structure that includes leads and a device substrate for one or more devices, where the leads and device substrate are held together during early fabrication stages with sacrificial features. The sacrificial features ensure that the leads and device substrate remain in desired physical orientations, with respect to each other, prior to encapsulation of the device. For convenience of illustration and description, the Figures do not indicate the leadframe sacrificial features, and they depict fabrication of only a single device. Those of skill in the art would understand, based on the description herein, that a leadframe may include leads and device substrates for multiple devices (e.g., in a strip or array format), and that multiple devices may be fabricated in parallel.

Figure 2:
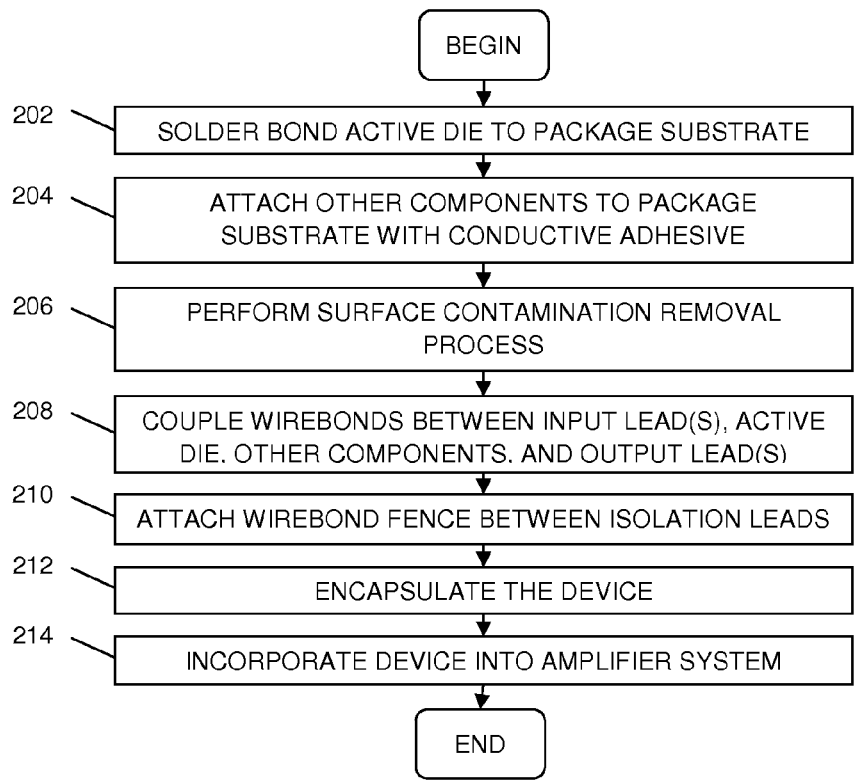
FIG. 2 is a flowchart of a method of manufacturing a packaged RF amplifier device, in accordance with an example embodiment.

FIG. 2 is a flowchart of a method of manufacturing a packaged RF amplifier device, in accordance with an example embodiment. FIG. 2 should be viewed simultaneously with FIGS. 3-12, which are top and side, cross-sectional views of several example embodiments of RF amplifier devices at various stages of manufacture.

Figure 3:
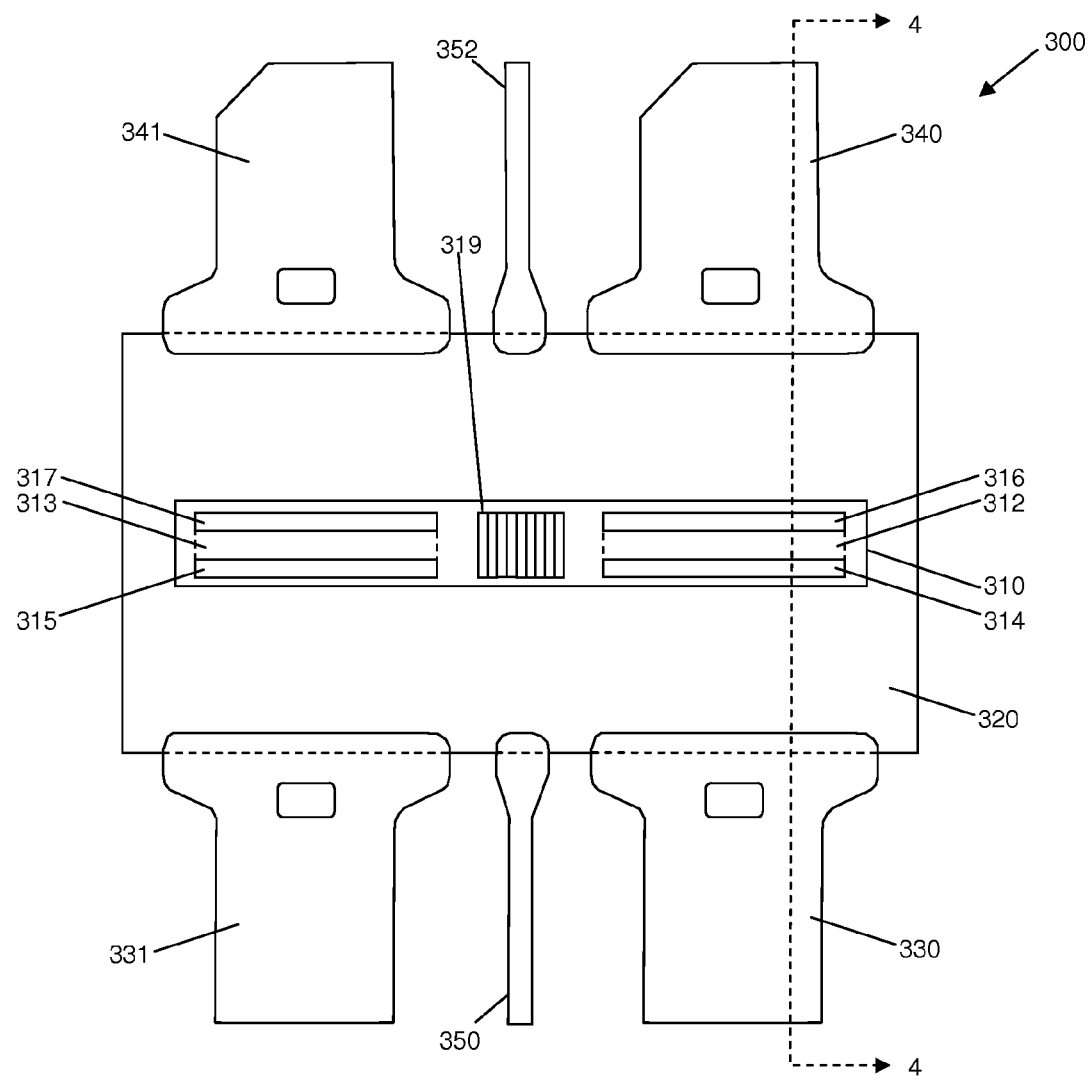
FIGS. 3-12 are top and side, cross-sectional views of several example embodiments of RF amplifier devices at various stages of manufacture.
Figure 4:
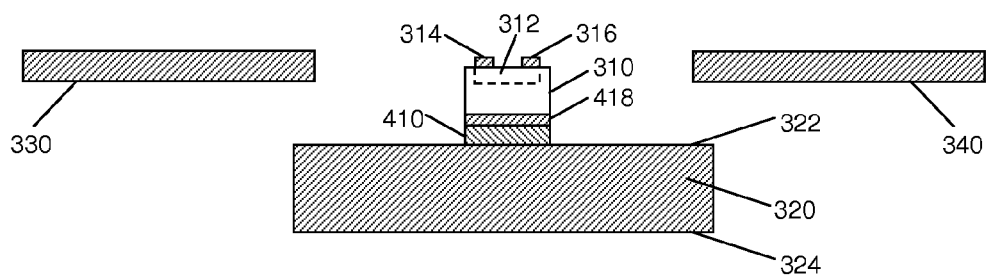

Referring first to block 202 and FIGS. 3 and 4, which are top and side (along line 4-4) cross-sectional drawings of a partially-fabricated device 300, fabrication of a packaged RF amplifier device may include solder bonding one or more active die (e.g., die 310) to a top surface of a device substrate (e.g., surface 322 of substrate 320). For example, the device substrate 320 may form a portion of a leadframe, which also includes one or more input leads (e.g., input leads 330, 331) and one or more output leads (e.g., output leads 340, 341). In the illustrated embodiment, the leadframe includes the device substrate 320, two input leads 330, 331, two output leads 340, 341, and two isolation leads 350, 352. In other embodiments, a leadframe may include only one input lead and one output lead, or may include more than two input and/or output leads. Further, a leadframe may include bias leads and leads for other purposes. In addition, although the device leads 330, 331, 340, 341, 350, 352 are shown in FIG. 4 to be in a plane above the top surface 322 of the device substrate 320, some or all of the leads 330, 331, 340, 341, 350, 352 may be co-planar with or below the device substrate 320. Generally, the leads 330, 331, 340, 341, 350, 352 are oriented in order to allow for attachment of wirebonds (e.g., wirebonds 710-713, 716, 717) between the leads 330, 331, 340, 341, 350, 352 and components and elements coupled to device substrate 320.

The device substrate 320 includes one or more rigid materials with an electrically conductive top surface 322. For example, the substrate 320 may be formed from a solid conductive material (e.g., a solid copper flange) or from a plurality of conductive and non-conductive layers (e.g., from printed circuit board materials with conductive layers). In the latter embodiment, the layer corresponding to the top surface 322 of the device substrate 320 is a conductive layer. In whichever embodiment, the conductive top surface 322 of the substrate 320 (or the substrate 320 itself) provides a voltage reference plane for the device (e.g., a ground plane) when the device is incorporated into a larger electrical system (e.g., attached to a printed circuit board which includes addition portions of an amplifier system).

Device substrate 320 has a thickness that is sufficient to provide structural support for other components and elements of the device. In addition, substrate 320 may function as a heat sink for the active die 310 and other devices mounted on substrate 320. Device substrate 320 has top and bottom surfaces 322, 324 and a substantially-rectangular perimeter that corresponds to the perimeter of the device.

According to an embodiment, die 310 includes one or more transistors 312, 313 formed in and over a surface of a semiconductor substrate (e.g., a silicon, silicon-on-insulator, silicon-on-sapphire, gallium arsenide, gallium nitride, or other type of substrate). For example, die 310 is shown to include two transistors 312, 313, each of which may be a FET. In a specific embodiment, each of transistors 312, 313 is a laterally diffused MOSFET (or LDMOS transistor), which includes a gate (control terminal), a drain (a first current conducting terminal), and a source (a second current conducting terminal). Each gate is electrically coupled to a gate terminal 314, 315 at a top surface of the die 310, and each drain region is electrically coupled to a drain terminal 316, 317 at a top surface of the die 310. The source regions are electrically coupled to a source terminal 418 at a bottom surface of the die 310. For example, the source terminal 418 may correspond to a conductive layer on the bottom surface of the die 310. Those of skill in the art would understand, based on the description herein, that the "source" and the "drain" terminals essentially are current conducting terminals, and that they may be interchanged in an alternate embodiment (e.g., the source terminal may be at a top surface of the die 310 and the drain terminal may be at a bottom surface of the die 310).

As shown in FIG. 3, the transistors 312, 313 are spatially separated from each other, and the die 310 also includes one or more conductive structures 319 at a top surface of the die 310 in the region between the transistors 312, 313. As will be explained in more detail later, the conductive structure 319 enables an isolation structure (e.g., wirebond fence 720, FIG. 7A) to be coupled to the die 310. The isolation structure provides for increased isolation between the signal paths associated with each of the transistors 312, 313.

Attachment of the die 310 to the device substrate 320 includes dispensing solder 410 (e.g., in paste form) on either or both the bottom surface of the die 310 or the top surface 322 of the device substrate 320. The die 310 is then positioned on the top surface 322 of the device substrate 320, and the assembly is heated to a temperature that is sufficient to melt the solder and form a eutectic bond between the die 310 and the device substrate 320. For example, the solder bonding temperature may be in a range of about 275 degrees Celsius (C) to about 365 degrees C., although higher or lower temperatures alternatively may be used. In alternate embodiments, die 310 may be attached to the top surface 322 of the device substrate 320 using solder bumps, by eutectic bonding (e.g., gold eutectic bonding), using a sintering process (e.g., silver sintering), or using another die attachment technique.

Figure 5:
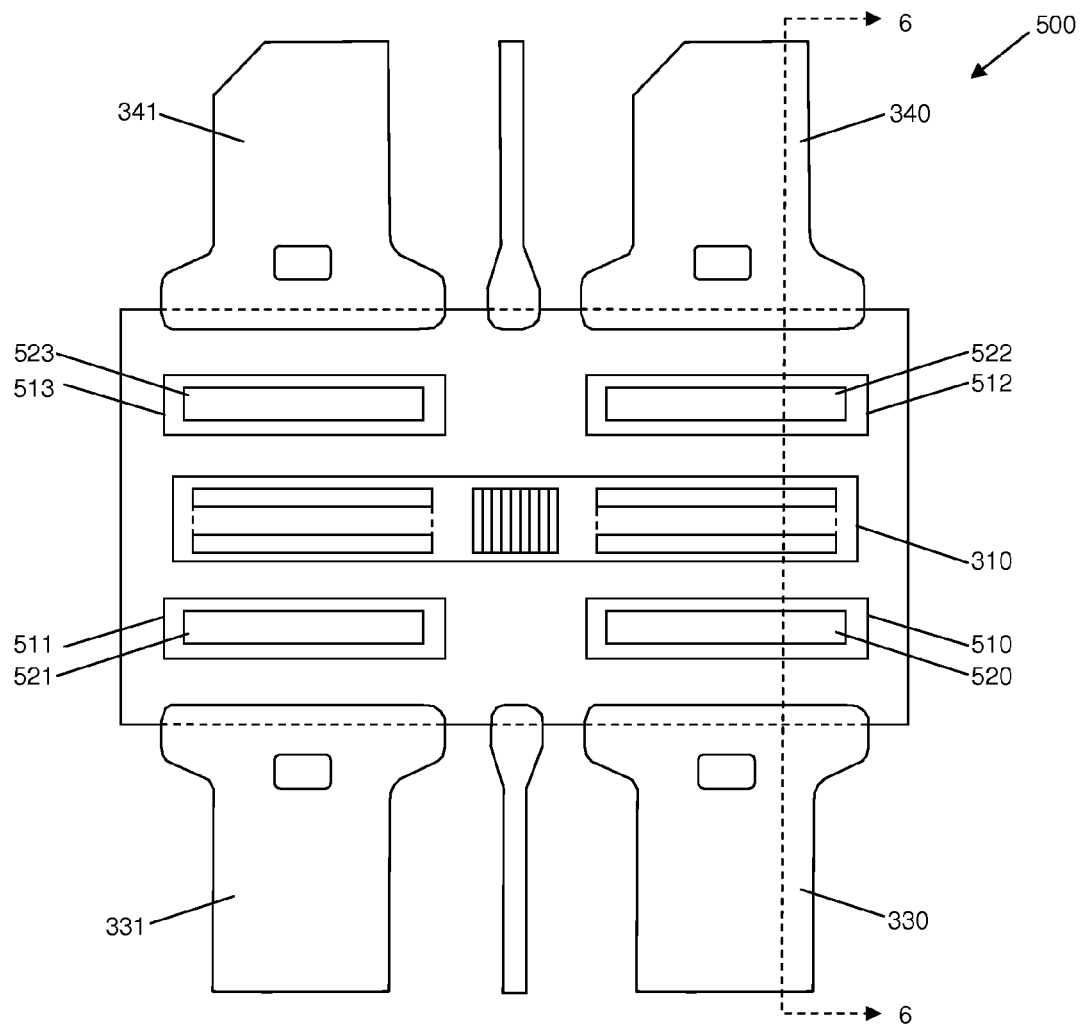
Figure 6:
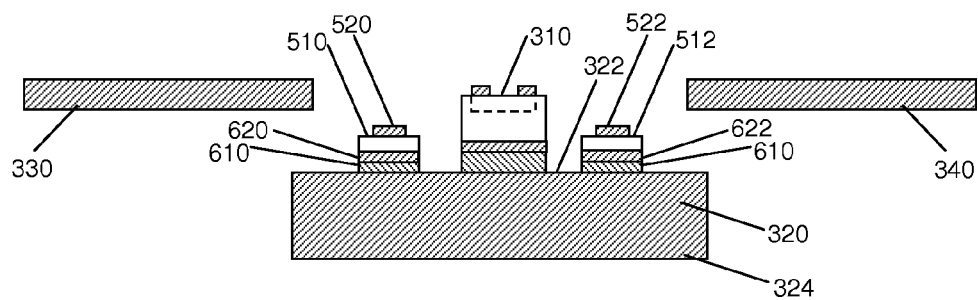

Referring now to block 204 and FIGS. 5 and 6, which are top and side (along line 6-6) cross-sectional drawings of a partially-fabricated device 500, fabrication of a packaged RF amplifier device continues by attaching other components to the top surface 322 of the device substrate 320. More specifically, an embodiment includes attaching IPDs 510, 511, 512, 513 to the top surface 322 of the device substrate 320 using a conductive epoxy 610. Although the Figures and the description herein refer to attaching IPDs (e.g., IPDs 510-513) to the device substrate 320 using a conductive epoxy, other embodiments may include attaching other types of components to the top surface of a device substrate using a conductive epoxy. For example, some or all of IPDs 510-513 may be replaced with metal-oxide-semiconductor capacitors (MOSCAPs), discrete ceramic capacitors, or other types of capacitors. In addition, other types of passive and/or active components or devices may be attached to the top surface of a device substrate using a conductive epoxy, including but not limited to other discrete or integrated passive components, phase shifters, amplitude adjusters, signal splitters, signal combiners, power or current meters, microcontrollers, and so on.

As will be described in more detail later, some or all of the IPDs 510-513 may include a semiconductor substrate over which one or more capacitors (and/or other passive components) are formed and/or coupled. In a particular embodiment, the IPDs 510-513 each include one or more metal-insulator-metal (MIM) capacitors formed over the semiconductor substrate, where a first (e.g., top) electrode of each capacitor is coupled to a conductive pad 520, 521, 522, 523 at the top surface of the IPD 510-513, and a second (e.g., bottom) electrode of each capacitor is coupled through the substrate (e.g., using TSVs) to a conductive layer 620, 622 on the bottom surface of the IPDs 510-513.

Attachment of the IPDs 510, 511, 512, 513 to the device substrate 320 includes dispensing the conductive epoxy 610 (e.g., in uncured form) on either or both the bottom surface (i.e., the conductive layer 620, 622) of the IPDs 510, 511, 512, 513 or the top surface 322 of the device substrate 320. The IPDs 510, 511, 512, 513 are then positioned on the top surface 322 of the device substrate 320, and an epoxy curing process is performed to harden the epoxy 610. For example, the curing process may include heating the assembly (e.g., in a nitrogen atmosphere) to a temperature in a range of about 150 degrees C. to about 260 degrees C. for a period of time ranging from less than one minute to about 90 minutes, depending on the selected epoxy. The above-given temperatures and time ranges may be larger or smaller, in other embodiments.

In an embodiment in which the device is a high-power RF amplifier device, and IPDs 512, 513 correspond to capacitors of output impedance matching circuits (e.g., capacitor 136 of circuit 130, FIG. 1), the conductive epoxy 610 has a current-carrying capability that is sufficient to handle the currents that will flow through the capacitors to the voltage reference plane. According to a specific embodiment, the conductive epoxy has a current-carrying capability greater than 2.0 Amps/square millimeter ($Amp/mm^2$) at an operational temperature of about 150 degrees C. According to another embodiment, the conductive epoxy has a current-carrying capability greater than 2.5 Amps/$mm^2$ at about 150 degrees C. According to yet another embodiment, the conductive epoxy has a current-carrying capability greater than 3.0 Amps/mm$^2$ at about 150 degrees C.

The conductive epoxy curing process may produce gasses, which cause the top surface 322 of the device substrate 320 to be contaminated. This contamination may compromise the ability to establish, in a later fabrication step (e.g., block 208), robust connections between wirebonds (e.g., wirebonds 721-723, FIG. 7A) and the top surface 322 of the device substrate 320. According to an embodiment, in block 206, the top surface 322 of the device substrate 320 is subjected to a surface contamination removal process in order to substantially remove contamination from the top surface 322 that may have been formed during the epoxy curing (or other) process. According to a specific embodiment, the surface contamination removal process includes performing a plasma cleaning process over the top surface 322 of the device substrate 320. In other embodiments, other methods of removing contamination at least in areas in which wirebonds subsequently will be attached to the top surface 322 may be performed. For example, another surface contamination removal method may include exposing the partially-formed device to a forming gas (e.g., nitrogen with up to about 5.0 percent hydrogen) in a heated tunnel or chamber.

Figure 7A:
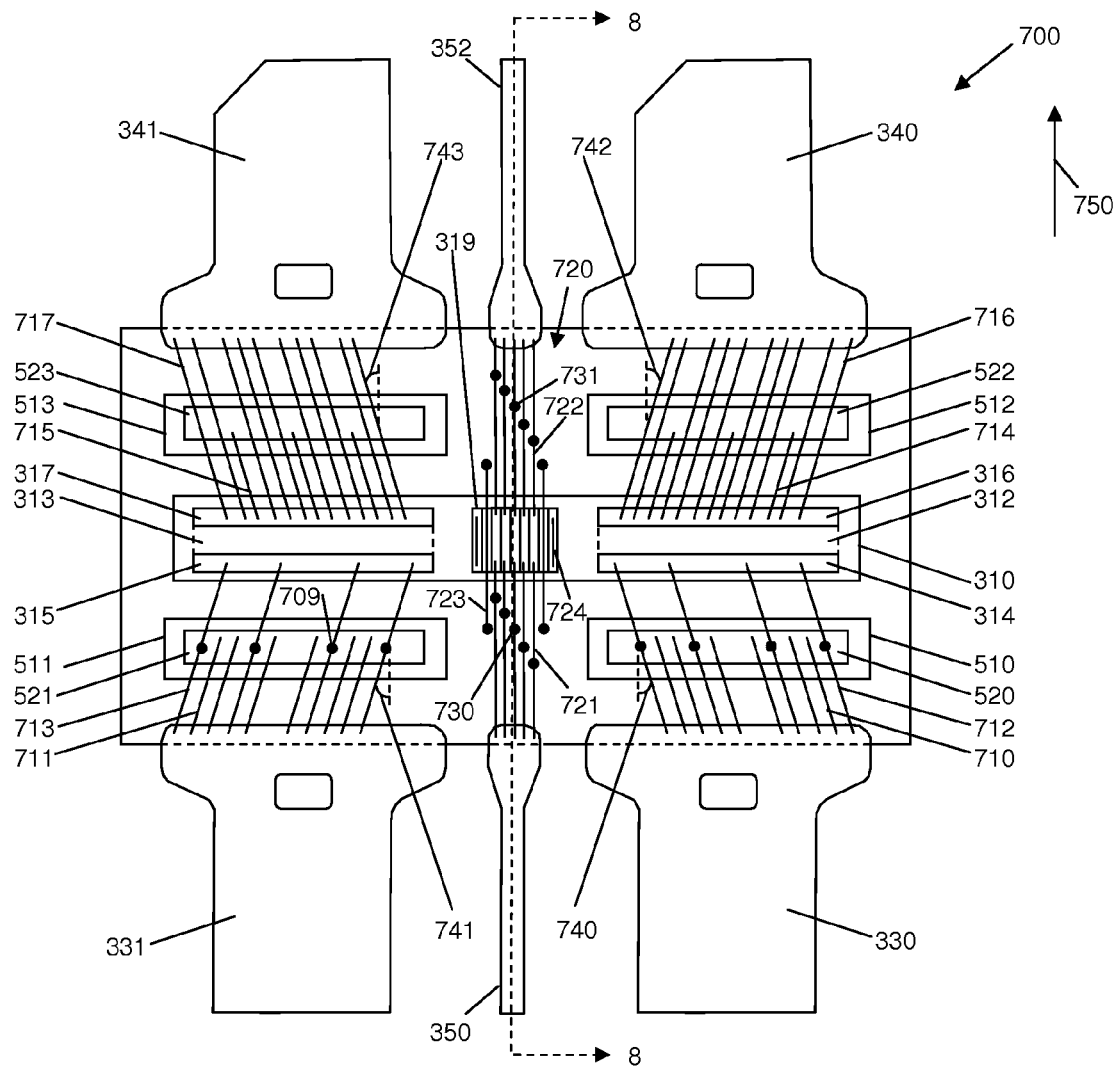

Referring now to block 208 and FIGS. 7A, B and 8A, B, C, which are top and side (along line 8-8) cross-sectional drawings of a partially-fabricated device 700 and portions of that device 700, fabrication of a packaged RF amplifier device continues by coupling sets of wirebonds 710, 711, 712, 713, 714, 715, 716, 717 between input leads 330, 331, active die 310, IPDs 510-513 (and/or other components), and the output leads 340, 341.

More specifically, the input leads 330, 331 are coupled to pads 520, 521 of IPDs 510, 511 with first sets of wirebonds 710, 711 and portions of second sets of wirebonds 712, 713. In addition, pads 520, 521 of IPDs 510, 511 are coupled to the control terminal pads 314, 315 of transistors 312, 313 through second portions of the second sets of wirebonds 712, 713. For example, in an embodiment, the second sets of wirebonds 712, 713 may extend between the input leads 330, 331 and the control terminal pads 314, 315 of transistors 312, 313, and may be tacked (roughly at their centers) to pads 520, 521 of IPDs 510, 511 (e.g., as indicated by tack point 709). On the output side of the device, the current conducting terminal pads 316, 317 (e.g., the drain pads) of transistors 312, 313 are coupled to pads 522, 523 of IPDs 512, 513 with third sets of wirebonds 714, 715. In addition, the current conducting terminal pads 316, 317 (e.g., the drain pads) of transistors 312, 313 are coupled to output leads 340, 341 with fourth sets of wirebonds 716, 717.

Each set of wirebonds 710-717 is formed from a plurality of parallel, closely-spaced bonding wires. According to an embodiment, some or all of the sets of wirebonds 710-717 extend between a lead 330, 331, 340, 341 and a die or IPD pad 314, 315, 316, 317, 520, 521, 522, 523 at an angle 740, 741, 742, 743 that is offset from a primary signal flow direction 750. According to a more specific embodiment, sets of wirebonds 710, 712 extend between input lead 330 and pads 314, 520 at a positive first angular offset 740 from the primary signal flow direction 750, and sets of wirebonds 711, 713 extend between input lead 331 and pads 315, 521 at a negative first angular offset 741 from the primary signal flow direction 750. Similarly, sets of wirebonds 714, 716 extend between pad 316 and output lead 340 or pad 522 at a negative second angular offset 742 from the primary signal flow direction 750, and sets of wirebonds 715, 717 extend between pad 317 and output lead 341 or pad 523 at a positive second angular offset 743 from the primary signal flow direction 750.

Inductive coupling between wirebonds is the greatest when adjacent wirebonds extend in parallel with each other, and is at a minimum when adjacent wirebonds extend in orthogonal directions. Accordingly, angling the sets of wirebonds 710-717 in adjacent signal paths functions to decrease the level of inductive coupling between wirebonds 710, 712, 714, 716 of the first signal path and wirebonds 711, 713, 715, 717 of the adjacent, second signal path. According to an embodiment, magnitudes of the positive and negative angular offsets 740-743 each is in a range of about 10 degrees to about 50 degrees. Accordingly, the total angular offset (i.e., the sum of the positive and negative angular offsets) between wirebonds in the adjacent first and second signal paths is in a range of about 20 degrees to about 100 degrees. For example, in one embodiment, the total angular offset between wirebonds in adjacent first and second signal paths is in a range of about 30 degrees to about 60 degrees. In another embodiment, the total angular offset between wirebonds in adjacent first and second signal paths is in a range of about 60 degrees to about 90 degrees. In yet another alternate embodiment, wirebonds along a first signal path may be substantially parallel to the primary signal flow direction for the first path, and the wirebonds along an adjacent second signal path may have a significant angular offset from the primary signal flow direction for the second signal path (e.g., resulting in a total angular offset between the adjacent sets of wirebonds in a range of about 20 degrees to about 100 degrees).

Connection of wirebonds 710-717 to the die 310 and the IPDs 510-513 completes the formation of the input and output impedance matching circuits (e.g., input impedance matching circuit 110 and output impedance matching circuit 130, FIG. 1). More specifically, each input impedance matching circuit (e.g., input impedance matching circuit 110) includes two inductive elements (e.g., inductive elements 112, 116, FIG. 1) corresponding to first and second wirebond sets 710-713, and a shunt capacitor (e.g., capacitor 114, FIG. 1) in the form of IPD 510, 511. Each output impedance matching circuit (e.g., output impedance matching circuit 130, FIG. 1) includes two inductive elements (e.g., inductive elements 132, 134, FIG. 1) corresponding to wirebond sets 714-717, and a shunt capacitor (e.g., capacitor 136, FIG. 1) in the form of IPD 512, 513.

Figure 8A:
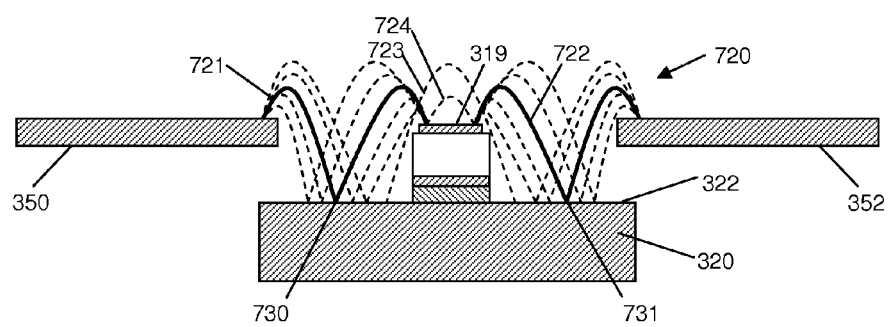

Referring now to FIGS. 7A and 8A, in block 210, which may be performed before, after, or simultaneously with block 208, a wirebond fence 720 (in the form of additional wirebonds 721-724) is coupled between isolation leads 350, 352, device substrate 320, and the conductive structure 319 at the top surface of die 310. The wirebond fence 720 extends into an area above the top surface of the active die 310 between the transistors 312, 313. The wirebond fence 720, when grounded or otherwise coupled to a voltage reference plane, provides additional attenuation of inductive coupling between wirebond sets 714-717 that may occur during operation of the device. In other words, wirebond fence 720 essentially is a structure that provides for increased isolation between the adjacent signal paths (i.e., wirebond fence 720 is an "isolation structure" that extends into an area above the top surface of the active die 310 between the transistors 312, 313). In other embodiments, other types of isolation structures may be coupled to the conductive structure 319. For example, other isolation structures positioned between adjacent signal paths and coupled to the conductive structure 319 may include a conductive wall, conductive pillars or vias, or a plated trench that extends vertically upward from the conductive structure 319 through the molding compound (e.g., molding compound 1110, FIG. 11) that overlies the active die 310.

According to an embodiment, wirebond fence 720 may include multiple sets of wirebonds 721-724 that are coupled in various ways between the isolation leads 350, 352, device substrate 320, and the conductive structure 319. For example, on the input side of the device, first wirebonds 721 are coupled between first isolation lead 350 and conductive structure 319, with an intermediate connection (at substrate contact point 730) directly to the top surface 322 of device substrate 320. On the output side of the device, second wirebonds 722 are coupled between conductive structure 319 and second isolation lead 352, with an intermediate connection (at substrate contact point 731) directly to the top surface of device substrate 320. Third wirebonds 723 are coupled to contact points on the top surface 322 of device substrate 320 on opposite sides of die 310. According to an embodiment, the third wirebonds 723 essentially hop over die 310, without contacting the conductive structure 319. Finally, fourth wirebonds 724 are coupled between the input side and the output side of the conductive structure 319.

Figure 7B:
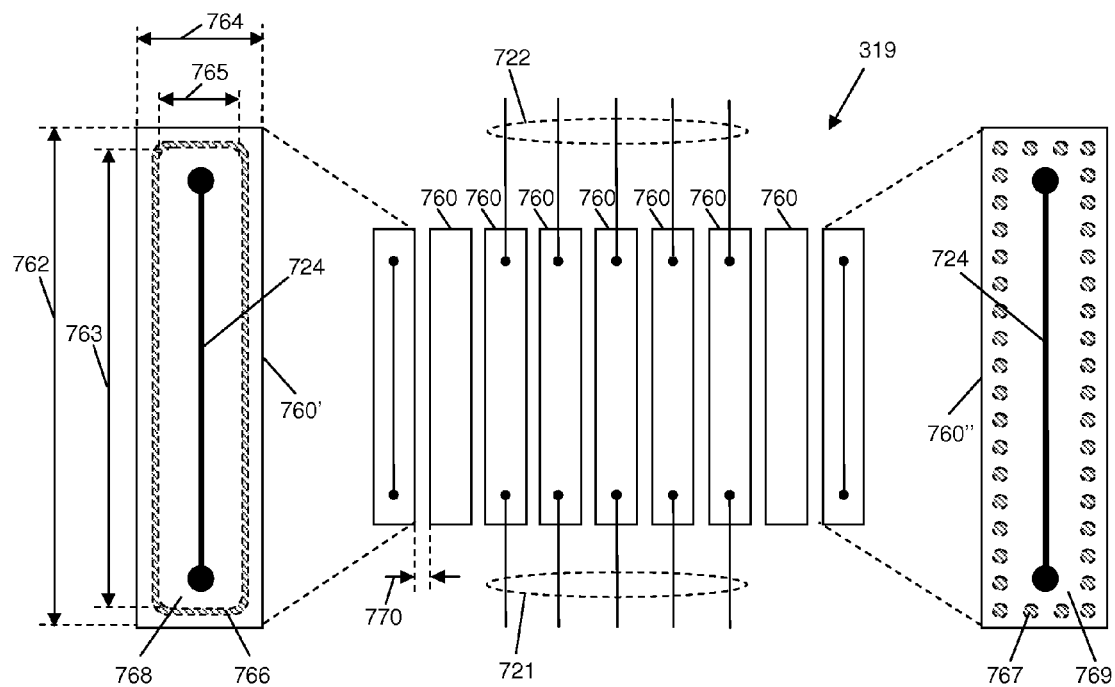

As shown in the enlarged, top view of conductive structure 319 in FIG. 7B, conductive structure 319 may include a plurality of conductive bonding traces 760, which are oriented in a substantially parallel arrangement. As indicated in the further enlarged depictions 760', 760" of two embodiments of bonding traces 760, each bonding trace 760 has a length 762 and a width 764. The length 762 of each bonding trace 760 may be any length between a minimum length for attachment of a wirebond (e.g., wirebond 721, 722, 724) to the bonding trace 760 up to the width of the active die 310 (e.g., the dimension of active die 310 in FIG. 7A that is parallel to the primary signal flow direction 750). The width 764 of each trace 760 may be any width between a minimum width for attachment of a wirebond to the bonding trace 760 up to the width of the conductive structure 319. According to an embodiment, the width 764 may be in a range of about 100 microns to about 300 microns, although the width 764 may be smaller or larger, as well. According to an embodiment, adjacent bonding traces 760 are separated from each other (e.g., by a portion of a dielectric layer) by a separation distance 770. According to an embodiment, the separation distance 770 is in a range of about 2 microns to about 10 microns, although the separation distance 770 may be smaller or larger, as well.

Conductive structure 319 is formed from one or more portions of a top conductive layer (e.g., metal layer 832, FIGS. 8B, C) of the active die 310. As will be explained in more detail in conjunction with FIGS. 8B, C, the portions of the top conductive layer corresponding to conductive structure 319 are electrically coupled to the bottom of active die 319 through a low resistance path that extends vertically through the active die 319. A portion of the low resistance path includes one or more vertical conductive structures (e.g., structure 842, FIGS. 8B, C) through a dielectric layer that underlies the conductive structure 319 (e.g., dielectric layer 835, FIGS. 8B, C).

Figure 8B:
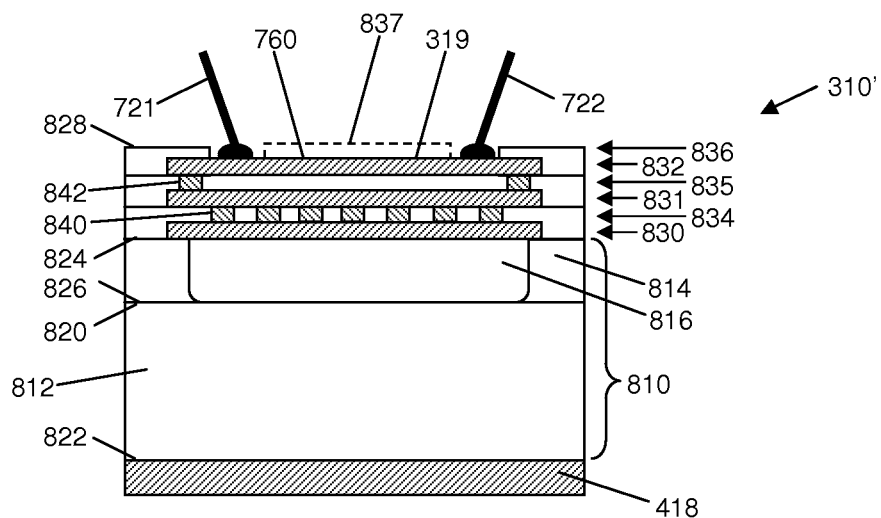

In one embodiment, and as shown in the enlarged depiction of a bonding trace 760' on the left side of FIG. 7B, the vertical conductive structure (e.g., structure 842, FIGS. 8B, C) may include a conductive trench 766 that electrically couples each bonding trace 760' to an underlying conductive layer (e.g., metal layer 831, FIGS. 8B, C). The conductive trench 766 may extend around an entire perimeter of each bonding trace 760', as shown in FIG. 7B. Alternatively, one or more conductive trenches may extend only partially around the perimeter of each bonding trace 760' (e.g., adjacent fewer than all four sides of each bonding trace 760'). In any event, a bonding area 768 is defined as a substantially central portion of each bonding trace 760', under which conductive trench 766 does not extend. For example, the bonding area 768 may have a length 763 and a width 765 that are in a range of about 5 percent to about 20 percent smaller than the length 762 and width 764 of the bonding trace 760'. According to an embodiment, the isolation structure(s) (e.g., wirebonds 721, 722, 724) are coupled to the bonding traces 760' within the bonding area 768. By excluding conductive trenches 766 from the areas underlying the bonding area 768, the topography of the bonding trace 760' within the bonding area 768 may be substantially flat, and more conducive to robust wirebond (or other isolation structure) attachment.

In another embodiment, and as shown in the enlarged depiction of a bonding trace 760" on the right side of FIG. 7B, the vertical conductive structure (e.g., structure 842, FIGS. 8B, C) may include a plurality of conductive vias 767 that electrically couple each bonding trace 760" to an underlying conductive layer (e.g., metal layer 831, FIGS. 8B, C). The conductive vias 767 may form a ring that extends around an entire perimeter of each bonding trace 760", as shown in FIG. 7B. Alternatively, the conductive vias 767 may extend only partially around the perimeter of each bonding trace 760" (e.g., adjacent fewer than all four sides of each bonding trace 760"). In any event, a bonding area 769 is defined as a substantially central portion of each bonding trace 760", under which conductive vias 767 are not positioned. According to an embodiment, the isolation structure (e.g., wirebonds 721, 722, 724) are coupled to the bonding traces 760" within the bonding area 769. Again, by excluding conductive vias 767 from the areas underlying the bonding area 769, the topography of the bonding trace 760" within the bonding area 769 may be substantially flat, and more conducive to robust wirebond (or other isolation structure) attachment.

Although the embodiment of FIG. 7B depicts nine parallel bonding traces 760, alternate embodiments may include more or fewer bonding traces 760. In addition, alternate embodiments may include bonding traces having different shapes than the rectangular shapes depicted in FIG. 7B, and/or the bonding traces may be oriented differently with respect to each other. In still another alternate embodiment, conductive structure 319 may be a single conductive feature to which the wirebonds or other isolation structure may be attached (e.g., a continuous portion of a conductive layer, rather than multiple distinct bonding traces). Further, although not depicted in FIG. 7B, passivation (e.g., passivation 837, FIGS. 8B, 8C) may overlie portions of conductive structure 319 (e.g., up to and including all portions except those portions to which wirebonds or another isolation structure are attached).

As discussed above, the portions of the top conductive layer corresponding to conductive structure 319 are electrically coupled to the bottom of active die 310 through a low resistance path that extends vertically through the active die 319, in an embodiment. For example, referring to FIG. 8B, which is an enlarged, cross-sectional view of an embodiment of active die 310' according to one embodiment, the conductive structure 319 is electrically coupled to the bottom-side terminal 418 of the active die 310' through a low resistance path that extends vertically through a plurality of metal and dielectric layers 830-832, 834, 835 and a low resistivity semiconductor substrate 810. For example, the active die 310' may include a semiconductor substrate 810 with various doped regions (e.g., corresponding to source, drain, and other regions) proximate the top surface 824 of the substrate 810. According to an embodiment, the semiconductor substrate 810 includes a relatively low resistivity base substrate 812 (e.g., of silicon or some other semiconductor material), and a higher resistivity epitaxial layer 814 formed over the top surface of the base substrate 812. For example, the base substrate 812 may be a relatively highly doped substrate of a first conductivity type (e.g., P++ doping, although substrate 812 alternatively may be N doped), and the epitaxial layer 814 may be an undoped or more lightly doped layer of the first conductivity type (e.g., P or P+ doping, although epitaxial layer 814 alternatively may be N doped) formed on the top surface 820 of the base substrate 812.

Along with other device regions (not shown) formed elsewhere in the epitaxial layer 814, a doped sinker region 816 is formed between top and bottom surfaces 824, 826 of the epitaxial layer 814. For example, the doped sinker region 816 may be a relatively highly doped region of the first conductivity type (e.g., P++ doping, although substrate 812 alternatively may be N doped), which provides a relatively low resistivity path between the top surface 824 of the epitaxial layer 814 and the top surface 820 of the base substrate 812. The low resistivity base substrate 812 and the doped sinker region 816 form portions of the low resistivity path between the conductive structure 319 and the bottom surface 822 of the active die 310' and the base substrate 812 (or the bottom-side terminal 418 of the active die 310').

Figure 8C:
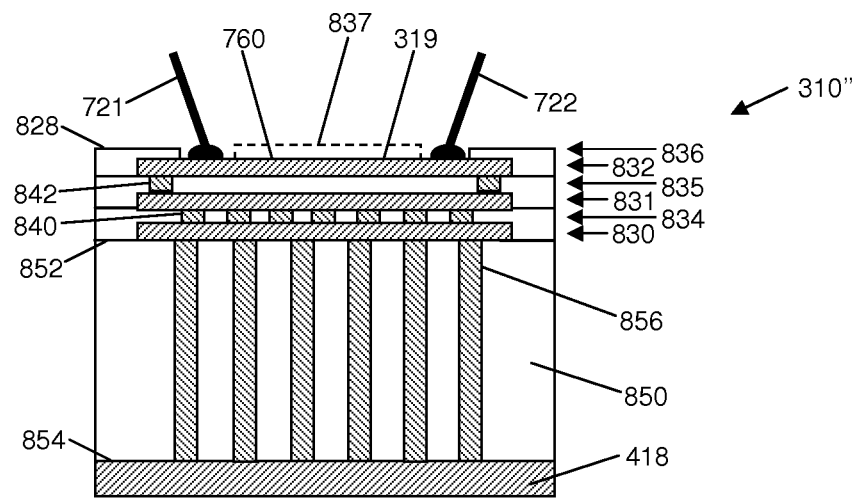

Referring now to FIG. 8C, which is an enlarged, cross-sectional view of active die 310" according to another embodiment, the conductive structure 319 is electrically coupled to the bottom-side terminal 418 of the active die 310" through a differently-configured low resistance path. In contrast with the embodiment of FIG. 8B, in the embodiment of FIG. 8C, the active die 310" may include a relatively high resistivity semiconductor substrate 850 (e.g., of silicon or some other semiconductor material) with a plurality of conductive through substrate vias (TSVs) 856 extending between top and bottom surfaces 852, 854 of the substrate 850. The TSVs 856 establish a low resistivity path between the top and bottom surfaces 852, 854 of the substrate 850. Accordingly, the TSVs 856 form a portion of the low resistance path between the conductive structure 319 and the bottom surface 854 of the active die 310" and the base substrate 850 (or the bottom-side terminal 418 of the active die 310").

In either of the embodiments of FIGS. 8B and 8C, a plurality of metal layers 830, 831, 832 and dielectric layers 834, 835 are built up over the top surfaces 824, 852 of the substrate 810, 850, where portions of the metal layers 830-832 are electrically coupled together with conductive structures 840, 842. A passivation layer 836 may overlie the top metal layer 832. According to an embodiment, a portion of the passivation layer 837 optionally may overlie a substantially central portion of the conductive structure 319 (e.g., central portions of the bonding traces 760). Although the embodiments of FIGS. 8B and 8C illustrate three metal layers 830-832, two dielectric layers 834, 835, and one passivation layer 836, other embodiments may include more or fewer metal and dielectric layers overlying the active device substrate, and other embodiments may exclude the passivation layer 836.

According to an embodiment, and as discussed above, conductive structure 319 (and more specifically bonding traces 760) may be formed from portions of top metal layer 832, and the conductive structure 319 may be electrically coupled to the top surfaces 824, 852 of the substrate 810, 850 (e.g., to the low resistivity sinker region 816 or to the tops of TSVs 856) through one or more of the lower metal layers 830, 831 and conductive structures 840, 842 through dielectric layers 834, 835. According to an embodiment, the conductive structure(s) 842 interconnecting the top metal layer 832 and the next-lowest metal layer 831 may include a trench (e.g., trench 766, FIG. 7B) or a plurality of conductive vias (e.g., vias 767, FIG. 7B). Conversely, the conductive structures 840 interconnecting all but the top metal layer (e.g., metal layers 830, 831) may include conductive vias though intervening dielectric layers (e.g., through dielectric layer 834). The conductive vias corresponding to conductive structures 840 may be configured in an array, for example, and may underlie substantially an entire area of a bonding trace (e.g., bonding traces 760, FIG. 7B). Alternatively, the conductive structures 840 may include conductive vias having a different configuration, and/or may include one or more conductive trenches.

Formation of the above-described structures results in a low resistance path between the conductive structure 319 at the top surface 828 of the active die 310, 310', 310" and the conductive terminal 418 at the bottom surface of the active die 310, 310', 310", thus enabling the conductive structure 319 to be coupled to ground through the active die 310, 310', 310". More specifically, and as shown in FIG. 8A, when the terminal 418 is coupled to the device substrate 320, and the device substrate 320 later is coupled to system ground (e.g., in block 214), the conductive structure 319 and the wirebond fence 720 (or other isolation structure) also are coupled to the system ground through the low resistance path that extends vertically through the active die 310. In various embodiments, the doped sinker region 816 (FIG. 8B) or the TSVs 856 (FIG. 8C) may or may not be located directly underneath the conductive structure 319 (i.e., the doped sinker region 816 or TSVs 856 may be located in any of a number of areas of the active die 310, 310', 310").

As mentioned previously, prior to block 210, a surface contamination removal process is performed in block 206 to substantially remove contamination on the top surface 322 of the device substrate 322 that may have formed during the epoxy bonding process of block 204. Removal of the contamination prior to block 210 enables robust connections (e.g., at contact points 730, 731) to be made between wirebonds 721-723 and the top surface 322 of the device substrate 320. If the surface contamination removal process were not performed, the contamination that formed during the epoxy bonding process of block 204 may inhibit formation of contacts between the wirebonds 721-723 and the substrate 320.

When the device is incorporated into a larger electrical system (e.g., attached to a printed circuit board which includes addition portions of an amplifier system), isolation leads 350, 352 may be coupled to a voltage reference (e.g., ground). Accordingly, the wirebond fence 720 (or other isolation structure) may be grounded through the isolation leads 350, 352. In addition, due to the coupling of the additional wirebonds 721-723 directly to the device substrate 320, the wirebond fence 720 also may be grounded through the device substrate 320.

Figure 9:
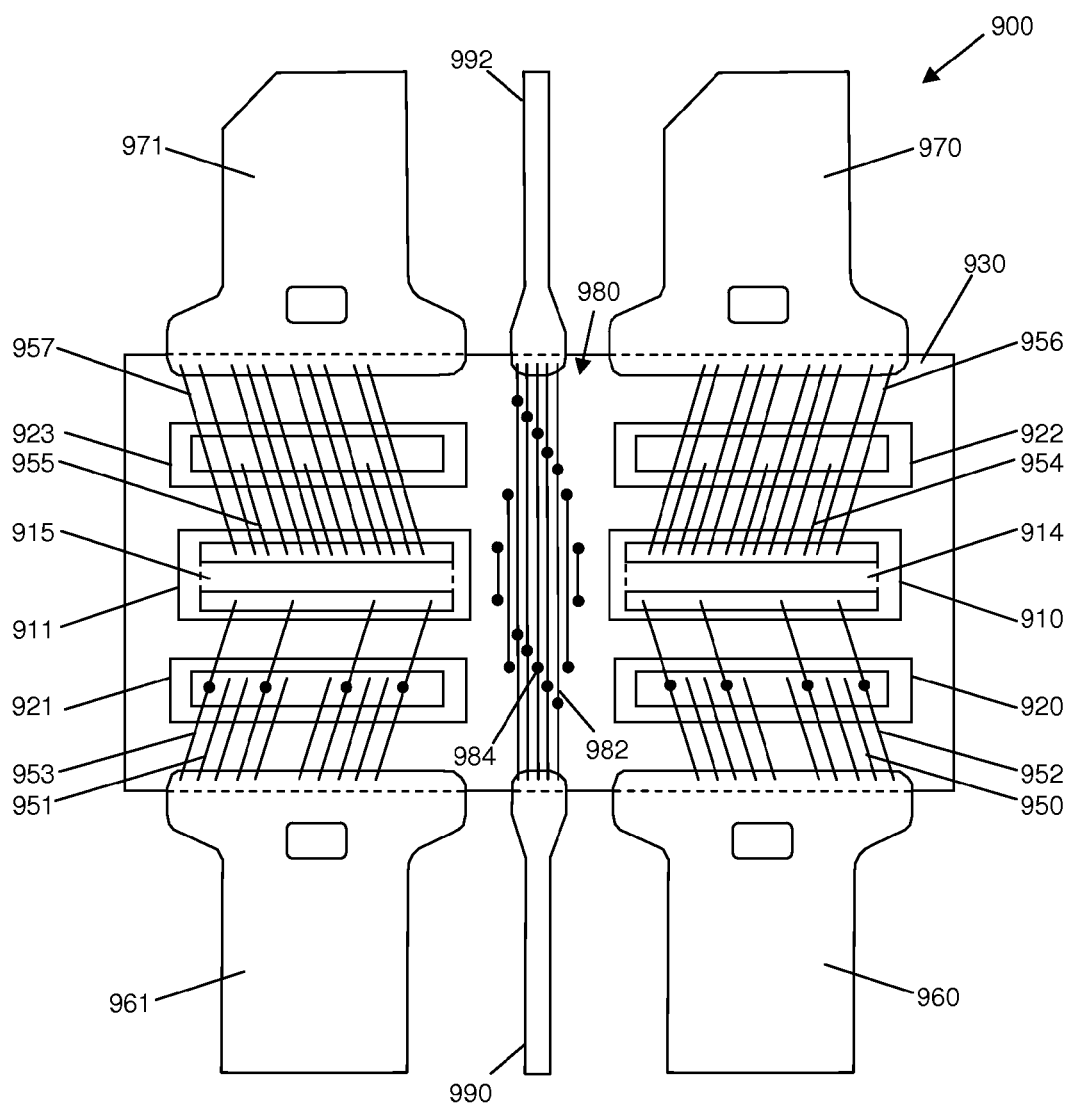

In the embodiments that have been described in conjunction with FIGS. 3-8, the device includes a single active die 310, two input-side IPDs 510, 511, and two output-side IPDs 512, 513. In an alternate embodiment, a device may include a separate active (transistor) die for each signal path. For example, FIG. 9 shows a top view of a partially-fabricated device 900 with two active die 910, 911 (each of which includes a transistor 914, 915), two input-side IPDs 920, 921, and two output-side IPDs 922, 923. As with the previously described embodiments, the active die 910, 911 are coupled to the top surface of device substrate 930 with a solder bond, and the IPDs 920-923 are coupled to the top surface of device substrate 930 with conductive epoxy. Further, the device 900 includes multiple sets of angled wirebonds 950, 951, 952, 953, 954, 955, 956, 957 coupled between input leads 960, 961, output leads 970, 971, active die 910, 911, and IPDs 920-923.

The device 900 also includes a wirebond fence 980 coupled between first and second isolation leads 990, 992. In contrast with the previously-described embodiments, however, none of the wirebonds 982 of the wirebond fence 980 are coupled to or across the active die 910, 911. Instead, each of the wirebonds 982 includes direct contact points 984 to the top surface of the device substrate 930.

In another alternate embodiment, a device may include one or more active die, each of which includes multiple amplifier (transistor) stages. In addition, impedance matching elements may be included on the die. For example, each signal path may include a pre-amplifier and a higher-power amplifier coupled in series, where the pre-amplifier is implemented with a first transistor, and the higher-power amplifier is implemented with a second and larger transistor. The first and second transistors can be implemented on the same die, in an embodiment, or they may be implemented on separate die, in another embodiment.

Figure 10:
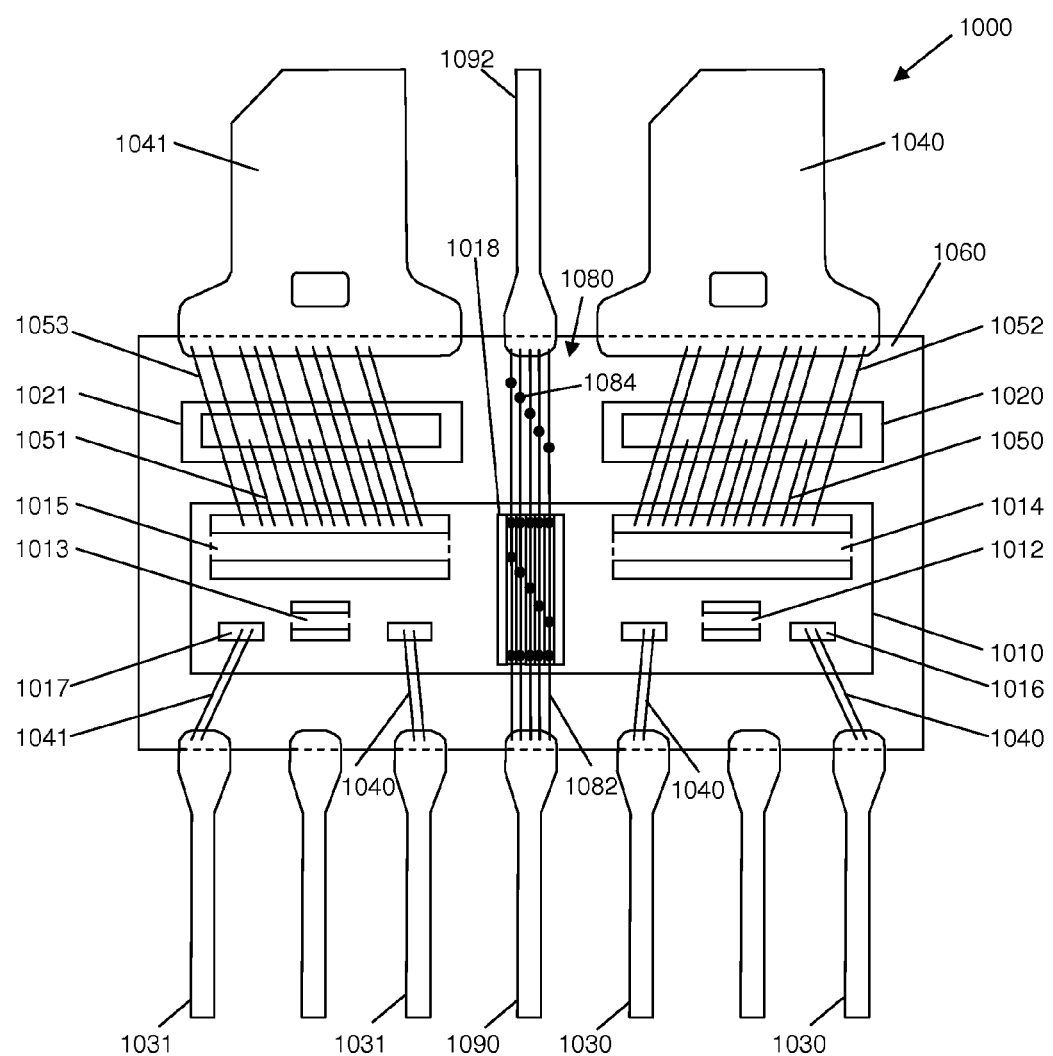

For example, FIG. 10 shows a top view of a partially-fabricated device 1000 with one active die 1010 that includes two transistors 1012, 1014 along a first signal path, and two transistors 1013, 1015 along a second signal path. More specifically, along each signal path, the die 1010 includes a first transistor 1012, 1013 corresponding to a relatively low-power amplifier (e.g., a pre-amplifier), and second transistor 1014, 1015 corresponding to a higher-power amplifier. The control terminals (e.g., gates) of the first transistors 1012, 1013 are coupled to input leads 1030, 1031 through wirebonds 1040, 1041, pads 1016, 1017, and impedance matching components (not illustrated) that are integrated within active die 1010. First current carrying terminals (e.g., drains) of the first transistors 1012, 1013 are coupled to the control terminals (e.g., gates) of the second transistors 1014, 1015 through additional impedance matching components (not illustrated) that are integrated within active die 1010. First current carrying terminals (e.g., drains) of the second transistors 1014, 1015 are coupled to output leads 1040, 1041 and to output-side IPDs 1020, 1021 through angled sets of wirebonds 1050, 1051, 1052, 1053. As with the previously described embodiments, the active die 1010 is coupled to the top surface of device substrate 1060 with a solder bond, and the IPDs 1020, 1021 are coupled to the top surface of device substrate 1060 with conductive epoxy.

The device also includes a wirebond fence 1080 coupled between first and second isolation leads 1090, 1092. Similar to the embodiment of FIG. 7A, the wirebonds 1082 of the wirebond fence 1080 are coupled to a conductive structure 1018 at the top surface of the active die 1010 in an area between the signal paths. As with the embodiment of FIG. 7A, the active die 1010 may include a low resistance path between the conductive structure 1018 and the bottom surface of the active die 1010. In addition, each of the wirebonds 1082 includes direct contact points 1084 to the top surface of the device substrate 1060.

Figure 11:
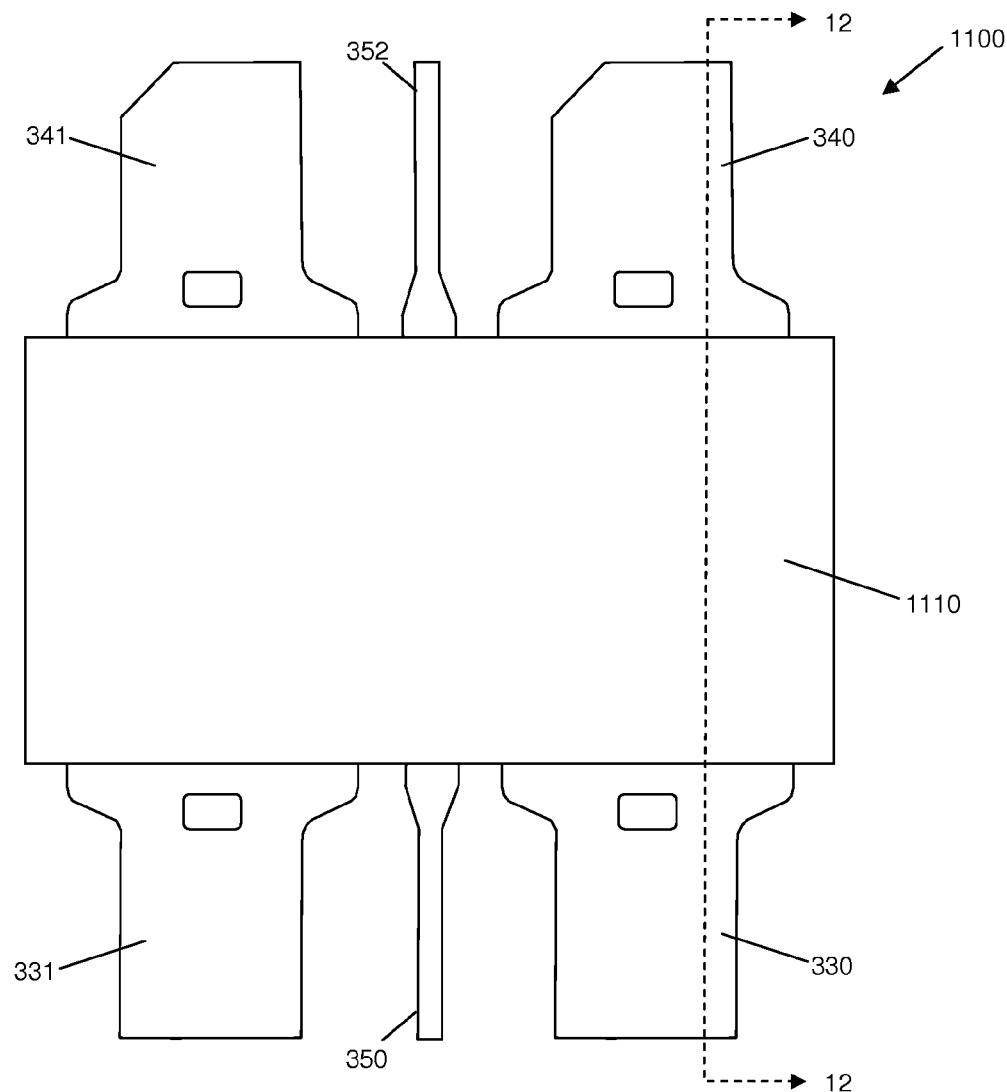
Figure 12:
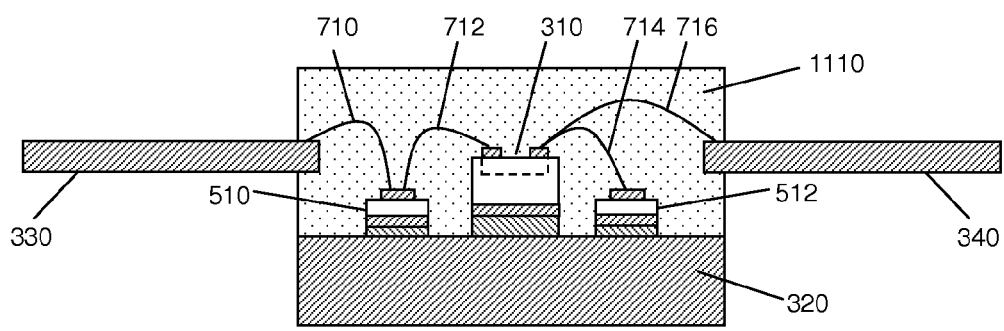

Referring again to FIG. 2 and to block 210, after attachment of the wirebonds or other isolation structure (e.g., wirebonds 710-717, 721-724, 950-957, 982, 1040, 1041, 1050-1053, 1082), the partially-fabricated device is encapsulated with a non-conductive molding compound. This process results in a completed device. Referring also to FIGS. 11 and 12, which are top and side (along line 12-12) cross-sectional drawings of a device 1100, the non-conductive molding compound 1110 may be coupled to the device 1100 by placing the partially-fabricated device (e.g., device 700) in a mold, dispensing the molding compound 1110 over the top surface of the device substrate 320 so that it encompasses the active die 310, the IPDs 510, 512, portions of the input leads 330, 331, and portions of the output leads 340, 341. The molding compound 1110 may then be cured in order to render it into a solid.

As mentioned previously, molding compound (e.g., molding compound 1110) imparts significant package stresses on the active die (e.g., active die 310, 910, 911, 1010) and other components (e.g., IPDs 510-513, 920-923, 1020, 1021) that the molding compound encompasses. As is known, thin die (e.g., IPDs 510-513, 920-923, 1020, 1021) may be more susceptible to bending or cracking from the package stresses imparted by molding compound than thicker die (e.g., active die 310, 910, 911, 1010). However, as also mentioned previously, relatively thin IPDs are desirable in that they may include higher quality capacitors than those that may be integrated within a thicker die (e.g., integrated within active die 310, 910, 911, 1010).

According to an embodiment, IPDs 510-513, 920-923, 1020, 1021 may have thicknesses in a range of about 50 microns to about 100 microns, and active die 310, 910, 911, 1010 may have thicknesses in a range of about 200 microns to about 300 microns. In other embodiments, IPDs 510-513, 920-923, 1020, 1021 and/or active die 310, 910, 911, 1010 may be thicker or thinner than the above-given ranges. In any event, although conventional active die with thicknesses within the above-given range typically are capable of withstanding the package stresses imparted by molding material in an overmolded package, conventional IPDs with thicknesses within the above-given range have not generally been capable of withstanding such package stresses without a significant incidence of IPD failures and/or device performance degradation. According to an embodiment, and as will be described in more detail in conjunction with FIGS. 13-15, IPDs that are incorporated into an overmolded package (e.g., IPDs 510-513, 920-923, 1020, 1021) have certain features that render them less susceptible to cracking or damage than conventional IPDs with comparable thicknesses.

Figure 13:
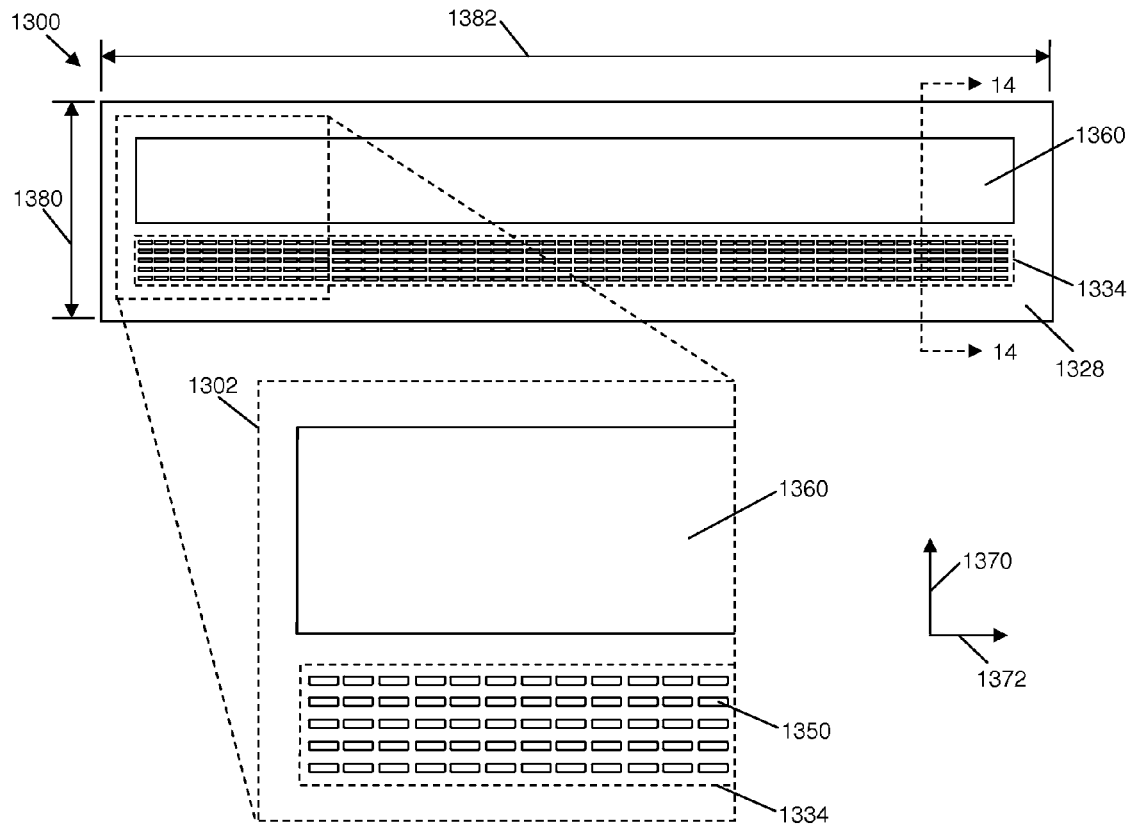
FIG. 13 is a top view of an integrated passive device (IPD) suitable for use in an impedance matching circuit in a packaged RF amplifier device, in accordance with an example embodiment.
Figure 14:
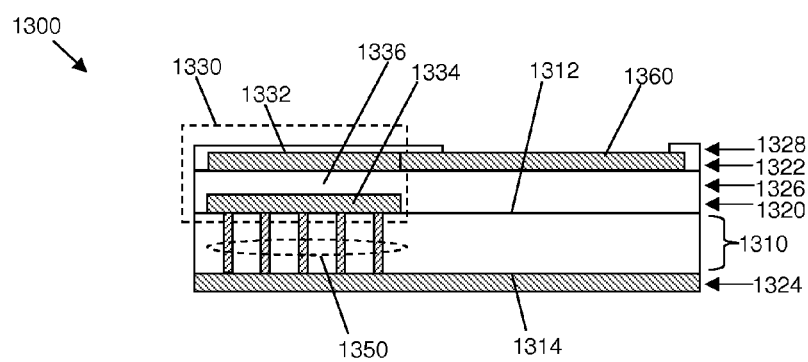
FIG. 14 is a cross-sectional, side view of the IPD of FIG. 13 along line 14-14.

FIG. 13 is a top view of an IPD 1300 (e.g., IPD 510-513, 920-923, 1020, 1021) suitable for use in an impedance matching circuit in a packaged RF amplifier device, in accordance with an example embodiment. Referring also to FIG. 14, which is a cross-sectional side view of IPD 1300 along lines 14-14, IPD 1300 includes a semiconductor substrate 1310 with top and bottom surfaces 1312, 1314. The semiconductor substrate 1310 may be formed from any of a variety of semiconductor materials, including but not limited to silicon, gallium arsenide, gallium nitride, and so on. A plurality of conductive layers 1320, 1322 and insulating layers 1326, 1328 are formed over the top surface 1312 of the substrate 1310, and an additional conductive layer 1324 is formed on the bottom surface 1314 of the substrate 1312 to facilitate electrical attachment to an underlying substrate (e.g., device substrate 320, FIG. 3), according to an embodiment. For example, conductive layer 1324 may be a gold (or other metal) layer, which facilitates forming a conductive bond between IPD 1300 and a separate conductive substrate (e.g., during the epoxy attach process of block 206, FIG. 2). The insulating layers 1326 function to selectively electrically isolate the conductive layers 1320, 1322.

IPD 1300 includes a capacitor 1330 (e.g., capacitor 114 or 136, FIG. 1), in an embodiment, which is illustrated in a simplified form in FIG. 14. Capacitor 1330 is implemented as metal-insulator-metal (MIM) capacitor (e.g., with parallel metal plates electrically separated by a thin dielectric), in an embodiment. Accordingly, capacitor 1330 includes a top capacitor electrode 1332 formed from a portion of a first conductive layer 1322, a bottom capacitor electrode 1334 formed from a portion of a second conductive layer 1320, and dielectric material 1336 formed from a portion of insulating layer 1326. The top and bottom capacitor electrodes 1332, 1334 are vertically aligned. Although the electrodes of capacitor 1330 are depicted in FIG. 13 as being portions of particular conductive layers 1320, 1322, the IPD capacitor may be formed from other conductive layers, as well. Further, although the dielectric portion of the capacitor 1330 is shown simply to be a portion of an insulating layer 1326, the dielectric portion may have a more complicated structure, in other embodiments.

To facilitate interconnection of capacitor 1330 to external circuitry (e.g., to active die 310, 910, 911, 1010, and/or to leads 330, 331, 340, 341, 960, 961, 970, 971, 1040, 1041), IPD 1300 also includes contact pad 1360 (e.g., contact pad 520-523) exposed at its top surface. According to an embodiment, contact pad 1350 is configured to accept attachment of one or more wirebonds (e.g., wirebonds 710, 711, 714, 715, 950, 951, 954, 955, 1014, 1015). The contact pad 1360 may be formed from the same conductive layer 1322 as top electrode 1332, as illustrated in FIG. 14, or the contact pad 1360 may be formed from a different conductive layer than top electrode 1332. When IPD 1300 is incorporated into an RF amplifier device as part of an output impedance matching circuit (e.g., circuit 130, FIG. 1), contact pad 1360 corresponds to the RF cold point.

Although the electrodes 1332, 1334 of the capacitor 1330 each are illustrated as being formed from portions of a particular conductive layers (i.e., layers 1320, 1322), the electrodes 1332, 1334 may be formed from different layers than those depicted in FIG. 13 (e.g., one or more other conductive layers, not illustrated, may be present below or above the conductive layers 1320, 1322 from which the electrodes 1332, 1334 are formed). In addition, although the capacitor 1330 is illustrated as a simple parallel plate capacitor consisting of a single top electrode and a single bottom electrode, the capacitor could have other types of capacitor structures, as well (e.g., the electrodes could consist of multiple, interleaved conductive structures, and so on). According to other embodiments, IPD 1300 may include additional components (not illustrated), such as one or more additional capacitors, inductors (e.g., spiral inductors, and/or resistors).

According to an embodiment, IPD 1300 also includes a set of conductive through substrate vias (TSVs) 1350 extending between the top and bottom surfaces 1312, 1314 of substrate 1310. TSVs 1350 are electrically coupled between the bottom capacitor electrode 1334 of capacitor 1330 and the conductive layer 1324 on the bottom surface 1314 of the substrate 1310. In an alternate embodiment, conductive pads or balls may be coupled to the ends of the TSVs 1350 (i.e., the ends that are coplanar with the bottom surface 1314 of the substrate 1310), rather than being electrically coupled to conductive layer 1324.

In the top view of FIG. 13, an array of TSVs 1350 underlying bottom electrode 1334 is illustrated. In actuality, TSVs 1350 would be covered by insulating layers 1326, 1328 and electrodes 1332, 1334, and thus TSVs 1350 would be hidden in a top view depiction of IPD 1300. For purposes of explanation, however, TSVs 1350 are depicted to indicate their cross sectional shapes and orientations with respect to other features of IPD 1300.

As is most clearly visible in the enlarged portion 1302 of IPD 1300, each TSV 1350 has an elongated or trench-like cross-sectional shape. More particularly, a width of each TSV 1350 measured in a direction 1370 that is parallel to a shorter dimension of the IPD 1300 (i.e., a width 1380 of IPD 1300) is significantly smaller than a length of each TSV 1350 measured in a direction 1372 that is perpendicular to the shorter dimension of each TSV 1350 (or measured in a direction 1372 that is parallel to a longer dimension (i.e., a length 1382) of IPD 1300. For example, the width to length ratio of each TSV 1350 is at least 1:5, in an embodiment. In another embodiment, the width to length ratio of each TSV 1350 is at least 1:10. According to a particular embodiment, the width of each TSV 1350 is in a range of about 1 micron to about 4 microns, and a length of each TSV 1350 is in a range of about 20 microns to about 40 microns. In a further embodiment, the width of each TSV 1350 is in a range of about 2 microns to about 3 microns, and a length of each TSV 1350 is in a range of about 25 microns to about 30 microns. TSVs 1350 may have larger or smaller widths and/or lengths, as well.

In any event, the orientation of the TSVs 1350 with their larger cross-sectional dimension being orthogonal to the shorter dimension of the IPD 1300 (i.e., the width 1380 of IPD 1300) may result in a significant increase in the ability of the IPD 1300 to resist cracking in the presence of manufacturing or package stresses (e.g., from overmolding material 1110, FIG. 11), when compared with other TSV designs.

Figure 15:
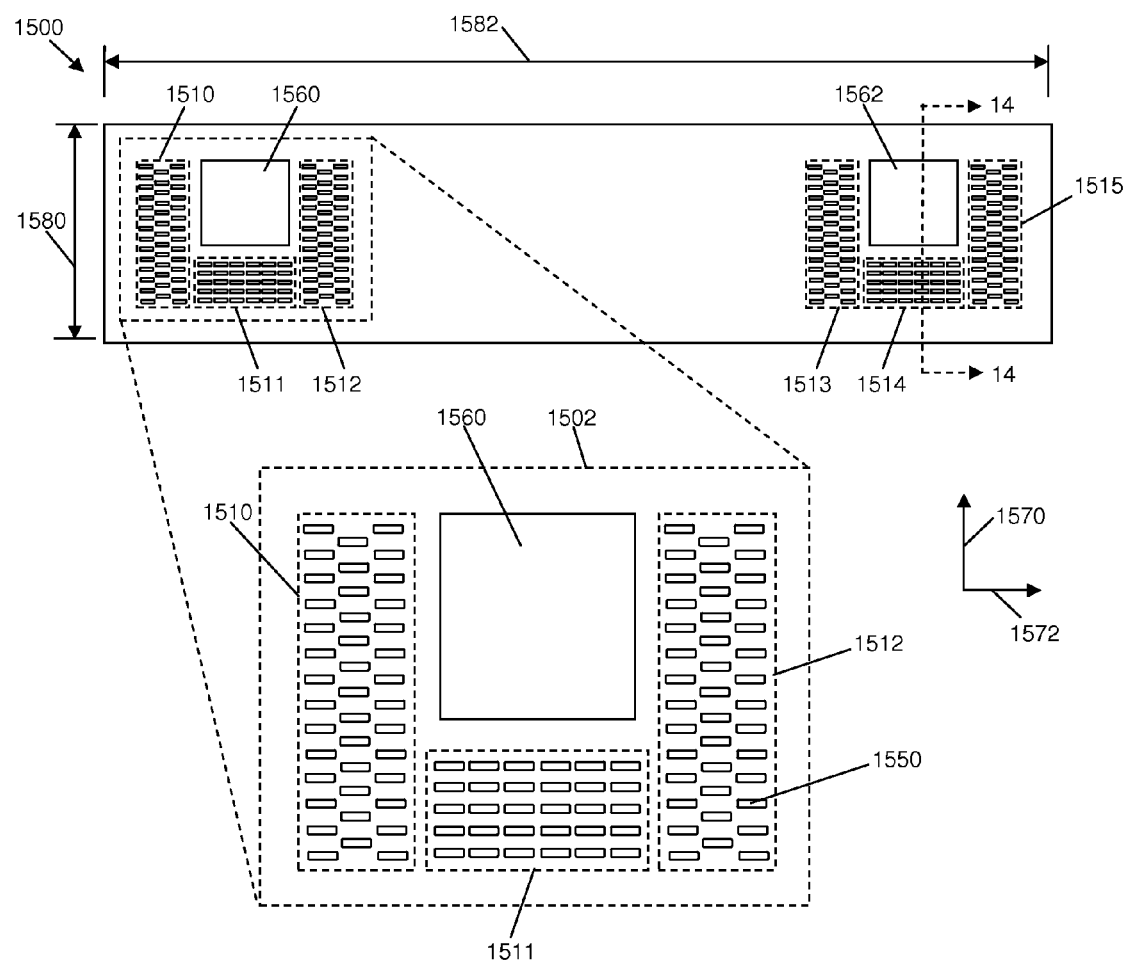
FIG. 15 is a top view of an IPD, in accordance with another example embodiment.

Although FIG. 13 depicts an IPD 1300 with a 5×54 array of TSVs 1350 arranged directly under a single bottom electrode 1334, other IPD embodiments may include more or fewer TSVs arranged in one or more arrays that may or may not directly underlie a bottom electrode. For example, FIG. 15 is a top view of an IPD 1500, in accordance with another example embodiment.

Similar to IPD 1300, IPD 1500 includes a semiconductor substrate with top and bottom surfaces, a plurality of conductive layers and insulating layers formed over the top surface of the substrate, and an additional conductive layer formed on the bottom surface of the substrate, according to an embodiment. In addition, IPD 1500 includes multiple capacitors 1510, 1511, 1512, 1513, 1514, 1515 (e.g., MIM capacitors), each of which may have a cross-section that is substantially similar to capacitor 1330, in an embodiment. Accordingly, each capacitor 1510-1515 may include top and bottom capacitor electrodes (the dimensions of which are indicated by dashed boxes 1520, 1521, 1522, 1523, 1524, 1525) formed from portions of first and second conductive layers and dielectric material between the top and bottom capacitor electrodes.

To facilitate interconnection of capacitors 1510-1515 to external circuitry (e.g., to active die 310, 910, 911, 1010, and/or to leads 330, 331, 340, 341, 960, 961, 970, 971, 1040, 1041), IPD 1500 also includes contact pads 1560, 1562 exposed at the top surface of IPD 1500. According to an embodiment, contact pads 1560, 1562 are configured to accept attachment of one or more wirebonds (e.g., wirebonds 710, 711, 714, 715, 950, 951, 954, 955, 1014, 1015).

The contact pads 1560, 1562 may be formed from the same conductive layer as the top electrodes, or the contact pads 1560, 1562 may be formed from a different conductive layer than the top electrodes.

According to an embodiment, IPD 1500 also includes sets of conductive TSVs 1550 extending between the top and bottom surfaces of the substrate, and electrically coupled between the bottom capacitor electrodes and the conductive layer on the bottom surface of the substrate. Although TSVs 1550 are depicted in the top view of FIG. 15, in actuality the TSVs 1550 would be hidden by the top and bottom electrodes and dielectric layers overlying the substrate.

In the top view of FIG. 15, arrays of TSVs 1550 underlying each of the bottom electrodes are illustrated. In some cases (e.g., for capacitors 1511, 1514), the arrays of TSVs 1550 are arranged in rows and columns, where the TSVs in adjacent rows are aligned with each other. In other cases (e.g., for capacitors 1510, 1512, 1513, 1515), the arrays of TSVs 1550 are arranged in rows and columns, where the TSVs in adjacent rows are offset from each other (i.e., not aligned with each other). Other IPD embodiments may include only arrays of aligned TSVs between columns, or only arrays of non-aligned TSVs between columns.

In any event, as is most clearly visible in the enlarged portion 1502 of IPD 1500, and similar to the embodiment of the IPD 1300 in FIG. 13, each TSV 1550 has an elongated or trench-like cross-sectional shape (i.e., a width of each TSV 1550 measured in a direction 1570 that is parallel to a shorter dimension of the IPD 1500 (i.e., a width 1580 of IPD 1500) is significantly smaller than a length of each TSV 1550 measured in a direction 1572 that is perpendicular to the shorter dimension of each TSV 1550 (or measured in a direction 1572 that is parallel to a longer dimension (i.e., a length 1582) of IPD 1500. For example, the width to length ratio of each TSV 1550 is at least 1:5, in an embodiment. In another embodiment, the width to length ratio of each TSV 1550 is at least 1:10. According to a particular embodiment, the width of each TSV 1550 is in a range of about 1 micron to about 4 microns, and a length of each TSV 1550 is in a range of about 20 microns to about 40 microns. In a further embodiment, the width of each TSV 1550 is in a range of about 2 microns to about 3 microns, and a length of each TSV 1550 is in a range of about 25 microns to about 30 microns. TSVs 1550 may have larger or smaller widths and/or lengths, as well.

In any event, the orientation of the TSVs 1550 with their larger cross-sectional dimension being orthogonal to the shorter dimension of the IPD 1500 (i.e., the width 1580 of IPD 1500) may result in a significant increase in the ability of the IPD 1500 to resist cracking in the presence of manufacturing or package stresses (e.g., from overmolding material 1110, FIG. 11), when compared with other TSV designs.

Although the embodiments described above pertain to an overmolded or encapsulated type of package, various aspects of the inventive subject matter alternatively may be implemented in an air cavity package, in which transistors (e.g., active die 310, 910, 911, 1010), impedance matching elements (e.g., including IPDs 510-513, 920-923, 1020, 1021 and wirebonds 710-717, 950-957, 1040, 1041, 1050-1053), isolation structure(s) (e.g., wirebond fence 720, 980, 1080), and/or other components of the device are located within an enclosed air cavity. In such an air cavity embodiment, the air cavity would be bounded by the device substrate, an isolation structure that electrically isolates the leads from the device substrate, and a cap overlying and in contact with the isolation structure and leads.

Referring again to FIG. 2, after encapsulation of the device 1100 in block 212, the device 1100 may be incorporated into an amplifier system in block 214. For example, the device 1100 may be incorporated into a Doherty amplifier (e.g., Doherty amplifier 1600, FIG. 16), as will be discussed in more detail below. Alternatively, the device 1100 may be incorporated into another type of multi-path amplifier. Incorporation of the device 1100 into an amplifier system includes mounting the device 1100 on a PCB (or other substrate) so that the device substrate 320 is electrically connected to the system's ground voltage reference. In addition, the device substrate 320 may be mounted so that it is in contact with a heat sink, such as a conductive coin embedded within the PCB. The input leads 330, 331 are electrically coupled to conductors on the PCB that are configured to convey first and second input RF signals from upstream portions of the amplifier system (e.g., from a signal splitter and RF signal generator). In addition, the output leads 340, 341 are electrically coupled to conductors on the PCB that are configured to convey amplified RF signals from the device 1100 to downstream portions of the amplifier system, including the load.

Figure 16:
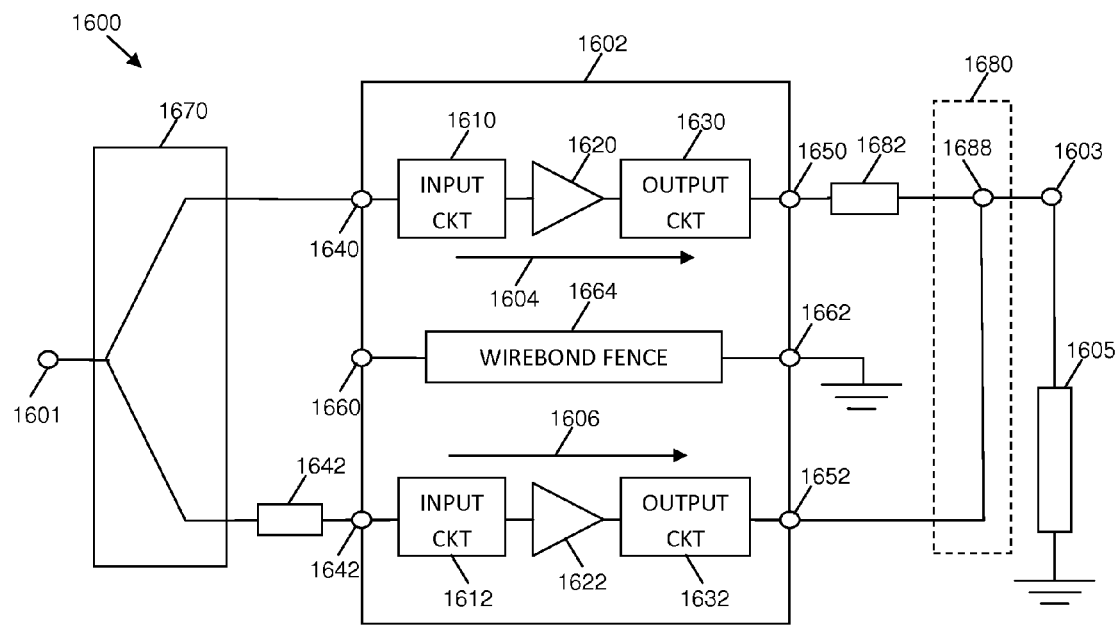
FIG. 16 is a simplified schematic diagram of a Doherty amplifier in which an embodiment of a packaged RF amplifier device may be incorporated.

FIG. 16 is a simplified schematic diagram of a Doherty amplifier system 1600 in which an embodiment of a packaged RF amplifier device (e.g., devices 900, 1000, 1100) may be incorporated. Amplifier system 1600 includes an input node 1601, an output node 1603, an RF amplifier device 1602, a power divider 1670, and a power combiner 1680, according to an embodiment. The power divider 1670 is coupled between input node 1601 and input terminals 1640, 1642 to the RF amplifier device 1602, and the power combiner 1680 is coupled between output terminals 1650, 1652 of the RF amplifier device 1602 and output node 1603. An input signal received at input node 1601 is amplified by amplifier system 1600 and provided to a load 1605 (e.g., an antenna) via output node 1603. As will be described in more detail below, the amplifier system 1600 is configured in a Doherty amplifier topology.

The RF amplifier device 1602 includes multiple amplifier paths 1604, 1606, and a wirebond fence 1664 (e.g., wirebond fence 720, 980, 1080) that reduces inductive coupling between the amplifier paths 1604, 1606. Each amplifier path 1604, 1606 includes an input impedance matching circuit (INPUT CKT) 1610, 1612, an amplifier stage 1620, 1622, and an output impedance matching circuit (OUTPUT CKT) 1630, 1632 coupled in series between input terminals 1640, 1642 and output terminals 1650, 1652 of the device 1602. According to an embodiment, one or more components (e.g., shunt capacitors and other components) of each input impedance matching circuit 1610, 1612 and each output impedance matching circuit 1630, 1632 may be implemented in an IPD (e.g., IPDs 510-513, 920-923, 1020, 1021).

Each of the input impedance matching networks 1610, 1612 is configured to provide a desired input impedance at its respective input terminal 1640, 1642 at the fundamental frequency (or carrier frequency) of the amplifier system 1600. Similarly, each of the output impedance matching networks 1630, 1632 is configured to provide a desired output impedance at its respective output terminal 1650, 1652 at the fundamental frequency of the amplifier system 1600. In an exemplary embodiment, the amplifier system 1600 is used to transmit RF signals, and the fundamental frequency (or carrier frequency) is the frequency of transmittance.

According to an embodiment, the input impedance matching networks 1610, 1612 are substantially identical to each other, and the output impedance matching networks 1630, 1632 also are substantially identical to each other. In other embodiments, the input impedance matching networks 1610, 1612 may be different from each other, and/or the output impedance matching networks 1630, 1632 may be different from each other. It should be noted that the subject matter described herein is not intended to be limited to any particular configuration and/or circuit topology for the input impedance matching networks 1610, 1612 and the output impedance matching networks 1630, 1632. That being said, in an embodiment, one or both of the input impedance matching networks 1610, 1612 are realized as a low-pass impedance matching circuit topology (e.g., a shunt capacitance impedance matching circuit topology). In alternate embodiments, either or both of the input impedance matching networks 1610, 1612 are realized as a high-pass impedance matching circuit topology. In an embodiment, either or both of the output impedance matching networks 1630, 1632 are realized as a high-pass impedance matching circuit topology, in an embodiment. In an alternate embodiment, either or both of the output impedance matching networks 1630, 1632 are realized as a low-pass impedance matching circuit topology.

The amplifier stages 1620, 1622 in RF amplifier device 1602 may be fabricated on the same die (e.g., as illustrated in FIGS. 3-8 and 10), or each amplifier stage 1620, 1622 may be fabricated on separate die (e.g., as illustrated in FIG. 9). Each of the amplifier stages 1620, 1622 includes an arrangement of one or more transistors. According to various embodiments, the amplifier stages 1620, 1622 may be symmetrical (i.e., substantially the same size) or asymmetrical (i.e., of different sizes).

Amplifier stage 1620 may be configured and operated as a main amplifier, and amplifier stage 1622 may be configured as and operated as a peaking amplifier. The main amplifier stage 1620 is configured as a Class AB amplifier, meaning that the transistor arrangement of main amplifier stage 1620 is biased to provide a conduction angle between 180 and 360 degrees. Conversely, the peaking amplifier stage 1622 is realized as a transistor arrangement configured as a Class C amplifier, meaning that the transistor arrangement of the peaking amplifier stage 1622 is biased to provide a conduction angle less than 180 degrees. Alternatively, the peaking amplifier stage 1622 may be connected to external control circuitry that dynamically adjusts the peaking amplifier's operating mode between Class AB and Class C at the RF signal's envelope rate depending on instantaneous output power requirements.

According to an embodiment, the multiple amplifier paths 1604, 1606 all are contained in a single device package with the input and output terminals 1640, 1642, 1650, 1652 and the isolation terminals 1660, 1662 providing external electronic connectivity to the device 1602. More specifically, the input and output terminals 1640, 1642, 1650, 1652 and the isolation terminals 1660, 1662 generally represent the package leads, pins, or other physical interfaces for creating electrical connections to the internal components (e.g., amplifier paths 1604, 1606 and wirebond fence 1664) of the RF amplifier device 1602. Referring to the previously described embodiments, for example, input terminals 1640, 1642 may correspond to input leads 330, 331, 960, 9611030, 1031, output terminals 1650, 1652 may correspond to output leads 340, 341, 970, 971, 1040, 1041, and isolation terminals 1660, 1662 may correspond to isolation leads 350, 352, 990 992, 1090, 1092.

In the illustrated embodiment of FIG. 16, the amplifier system 1600 is configured for a Doherty amplifier implementation. In this regard, the power divider 1670 is configured to divide the input power of the input signal received at node 1601 into multiple portions (e.g., equal portions) of the input signal, where respective portions of the input signal are provided to input terminals 1640, 1642. For example, a first output of the power divider 1670 may be coupled to the input terminal 1640 corresponding to the first amplifier path 1604, and a second output of the power divider 1670 may be coupled to the input terminal 1642 corresponding to the second amplifier path 1606. The power divider 1670 may divide the input power equally among the amplifier paths 1604, 1606, such that roughly half of the input signal power is provided to each amplifier path 1604, 1606. Alternatively, the power divider 1670 may divide the power unequally.

According to an embodiment, the amplifier system 1600 includes a first phase inversion element 1642 between a second output of the power divider 1670 and the input terminal 1642 corresponding to the peaking amplifier path 1606. For example, the first phase inversion element 1642 may be implemented as a quarter wave transmission transformer (e.g., a 90° phase length transmission line) or a lumped element implementation of a 90° phase transformer, in various embodiments. According to an embodiment, the amplifier system 1600 also includes a second phase inversion element 1682 between the output terminal 1650 corresponding to the main amplifier path 1604 and a summing node 1688 of the power combiner 1680. The output terminal 1652 corresponding to the peaking amplifier path 1606 also is coupled to the summing node 1688. As with the first phase inversion element 1642, the second phase inversion element 1682 may be implemented as a quarter wave transmission transformer (e.g., a 90° phase length transmission line) or a lumped element implementation of a 90° phase transformer, in various embodiments. The combination of phase inversion elements 1642, 1682 ensures that the currents ultimately provided to summing node 1688 by the respective amplifier paths 1604, 1606 are provided substantially in-phase with each other. Accordingly, the current provided by summing node 1688 to output node 1603 (and to load 1605) represents the in-phase summation of the currents provided by amplifier paths 1604, 1606. In an alternate embodiment, the amplifier system may be configured in an "inverted Doherty" configuration. In such a configuration, the input side phase inversion element is included at the input to the main amplifier path (rather than at the input to the peaking amplifier path), and the output side phase inversion element is included at the output of the peaking amplifier path (rather than at the output of the main amplifier path).

It should be understood that FIG. 16 is a simplified representation of an amplifier system 1600 for purposes of explanation and ease of description, and that practical embodiments may include other devices and components to provide additional functions and features, and/or the amplifier system 1600 may be part of a much larger electrical system, as will be understood. Thus, although FIG. 16 depicts direct electrical connections between circuit elements and/or terminals, alternative embodiments may employ intervening circuit elements and/or components while functioning in a substantially similar manner.

An embodiment of a packaged RF amplifier device includes a device substrate, a transistor die coupled to the top surface of the substrate, and an isolation structure coupled to the transistor die. The transistor die has a top die surface, a bottom die surface, a semiconductor substrate, first and second transistors formed in the semiconductor substrate, a conductive structure at the top die surface and positioned between the first and second transistors, and a low resistance path that extends vertically through the semiconductor substrate between the conductive structure and the bottom die surface. The conductive structure may be formed from one or more portions of a top metal layer of the device. The isolation structure is coupled to the conductive structure and extends into an area above the top die surface between the first and second transistors.

According to a further embodiment, the semiconductor substrate includes a relatively low resistivity base substrate, a relatively high resistivity epitaxial layer formed on the base substrate, and a relatively low resistivity doped sinker region formed between top and bottom surfaces of the epitaxial layer. The conductive structure is electrically coupled to the doped sinker region at the top surface of the epitaxial layer, and the base substrate and the doped sinker region form portions of the low resistance path. According to another further embodiment, the semiconductor substrate includes a plurality of conductive TSVs extending between top and bottom surfaces of the semiconductor substrate, and the conductive structure is electrically coupled to the plurality of TSVs. The plurality of TSVs form a portion of the low resistance path.

An embodiment of a method of manufacturing a packaged RF amplifier device includes coupling a transistor die to a top surface of a device substrate. The transistor die includes a top die surface, a bottom die surface, a semiconductor substrate, first and second transistors formed in the semiconductor substrate, a conductive structure at the top die surface and positioned between the first and second transistors, and a low resistance path that extends vertically through the semiconductor substrate between the conductive structure and the bottom die surface. In various embodiments, coupling the transistor die to the top surface of the device substrate may include coupling the transistor die to the top substrate surface with a conductive bond selected from a solder bond, a eutectic bond, and a sintered bond. The method further includes coupling an isolation structure to the conductive structure and extending into an area above the top die surface between the first and second transistors.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the embodiments shown in the figures depict certain exemplary arrangements of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A packaged radio frequency (RF) amplifier device comprising:
    a device substrate having a top substrate surface;
    a transistor die, wherein the transistor die includes a top die surface, a bottom die surface coupled to the top substrate surface, a semiconductor substrate, first and second transistors formed in the semiconductor substrate, a conductive structure at the top die surface and positioned between the first and second transistors, and a low resistance path that extends vertically through the semiconductor substrate between the conductive structure and the bottom die surface, wherein the first transistor forms a portion of a first signal path through the device, and the second transistor forms a portion of a second signal path through the device; and
    an isolation structure coupled to the conductive structure and extending into an area above the top die surface between the first and second transistors, wherein the isolation structure reduces inductive coupling between the first and second signal paths.

2. The packaged RF amplifier device of claim 1, wherein the semiconductor substrate comprises:
    a relatively low resistivity base substrate;
    a relatively high resistivity epitaxial layer formed on the base substrate; and
    a relatively low resistivity doped sinker region formed between top and bottom surfaces of the epitaxial layer, wherein the conductive structure is electrically coupled to the doped sinker region at the top surface of the epitaxial layer, wherein the base substrate and the doped sinker region form portions of the low resistance path.

3. The packaged RF amplifier device of claim 2, wherein the transistor die further comprises:
    a plurality of conductive layers formed over the semiconductor substrate, wherein the conductive structure is formed from a portion of a top conductive layer of the plurality of conductive layers, and wherein the conductive structure is electrically coupled to the doped sinker region.

4. The packaged RF amplifier device of claim 1, wherein the semiconductor substrate comprises:
a plurality of conductive through substrate vias extending between top and bottom surfaces of the semiconductor substrate, wherein the conductive structure is electrically coupled to the plurality of through substrate vias, and the plurality of through substrate vias form a portion of the low resistance path.

5. The packaged RF amplifier device of claim 4, wherein the transistor die further comprises:
a plurality of conductive layers formed over the semiconductor substrate, wherein the conductive structure is formed from a portion of a top conductive layer of the plurality of conductive layers, and wherein the conductive structure is electrically coupled to the plurality of through substrate vias at the top surface of the semiconductor substrate.

6. The packaged RF amplifier device of claim 1, wherein the transistor die further comprises:
a plurality of conductive layers formed over the semiconductor substrate, and
wherein the conductive structure comprises a plurality of conductive bonding traces formed from portions of a top conductive layer of the plurality of conductive layers, wherein adjacent bonding traces are separated by a separation distance, and wherein the conductive structure is coupled to the semiconductor substrate through the plurality of conductive layers.

7. The packaged RF amplifier device of claim 1, wherein the transistor die further comprises:
a plurality of conductive layers formed over the semiconductor substrate, wherein the conductive structure comprises at least one conductive bonding trace formed from a portion of a top conductive layer of the plurality of conductive layers;
a first dielectric layer underlying the top conductive layer and overlying a second conductive layer; and
at least one vertical conductive structure through the first dielectric layer and coupled between the top conductive layer and the second conductive layer.

8. The packaged RF amplifier device of claim 7, wherein the at least one vertical conductive structure includes a conductive trench that extends through the first dielectric layer and electrically couples the conductive structure and the second conductive layer.

9. The packaged RF amplifier device of claim 7, wherein the at least one vertical conductive structure includes a plurality of conductive vias that extend through the first dielectric layer and electrically couple the conductive structure and the second conductive layer.

10. The packaged RF amplifier device of claim 1, wherein the isolation structure comprises a plurality of wirebonds, and wherein at least some of the plurality of wirebonds are coupled between the conductive structure and the device substrate.

11. A packaged radio frequency (RF) amplifier device comprising:
a device substrate having a top substrate surface;
a transistor die coupled to the top substrate surface, wherein the transistor die includes a top die surface, a bottom die surface, a semiconductor substrate, first and second transistors formed in the semiconductor substrate, a conductive structure at the top die surface and positioned between the first and second transistors, and a low resistance path that extends vertically through the semiconductor substrate between the conductive structure and the bottom die surface;
an isolation structure coupled to the conductive structure and extending into an area above the top die surface between the first and second transistors; and
a first isolation lead positioned at a first side of the device substrate, wherein the isolation structure comprises a plurality of wirebonds, and wherein at least some of the plurality of wirebonds are coupled between the conductive structure and the first isolation lead.

12. The packaged RF amplifier device of claim 11, further comprising:
a second isolation lead positioned at a second side of the device substrate, wherein at least some of the plurality of wirebonds are coupled between the conductive structure and the second isolation lead;
first and second input leads coupled to the device substrate and positioned at the first side of the device substrate, wherein the first isolation lead is positioned between the first and second input leads; and
first and second output leads coupled to the device substrate and positioned at the second side of the device substrate, wherein the second isolation lead is positioned between the first and second output leads, and wherein the first transistor is coupled between the first input lead and the first output lead, and the second transistor is coupled between the second input lead and the second output lead.

13. The packaged RF amplifier device of claim 1, wherein the transistor die is coupled to the top substrate surface with a conductive bond selected from a solder bond, a eutectic bond, and a sintered bond.

14. The packaged RF amplifier device of claim 1, further comprising:
non-conductive molding compound over the top substrate surface and encompassing the transistor die and the isolation structure.

15. A method of manufacturing a packaged radio frequency (RF) amplifier device, the method comprising the steps of:
coupling a bottom die surface of a transistor die to a top surface of a device substrate, wherein the transistor die includes a top die surface, the bottom die surface, a semiconductor substrate, first and second transistors formed in the semiconductor substrate, a conductive structure at the top die surface and positioned between the first and second transistors, and a low resistance path that extends vertically through the semiconductor substrate between the conductive structure and the bottom die surface, wherein the first transistor forms a portion of a first signal path through the device, and the second transistor forms a portion of a second signal path through the device; and
coupling an isolation structure to the conductive structure and extending into an area above the top die surface between the first and second transistors, wherein the isolation structure reduces inductive coupling between the first and second signal paths.

16. The method of claim 15, wherein coupling the transistor die to the top surface of the device substrate comprises:
coupling the transistor die to the top substrate surface with a conductive bond selected from a solder bond, a eutectic bond, and a sintered bond.

17. The method of claim 15, wherein coupling the isolation structure to the conductive structure comprises:
   coupling a plurality of wirebonds to the isolation structure.
18. The method of claim 17, further comprising:
   coupling the plurality of wirebonds also to the top surface of the device substrate.
19. The method of claim 17, further comprising:
   coupling the plurality of wirebonds also to one or more isolation leads.
20. The method of claim 15, further comprising:
   disposing non-conductive molding compound over the top surface of the device substrate, wherein the non-conductive molding compound encompasses the transistor die and the isolation structure.

* * * * *